(12) United States Patent
Yvind

(10) Patent No.: US 9,634,464 B2
(45) Date of Patent: Apr. 25, 2017

(54) METHOD FOR GENERATING A COMPRESSED OPTICAL PULSE

(71) Applicant: Danmarks Tekniske Universitet, Kgs. Lyngby (DK)

(72) Inventor: Kresten Yvind, Virum (DK)

(73) Assignee: Danmarks Tekniske Universitet, Kgs. Lyngby (DK)

( * ) Notice: Subject to any disclaimer, the term of this patent is extended or adjusted under 35 U.S.C. 154(b) by 0 days.

(21) Appl. No.: 15/034,066

(22) PCT Filed: Nov. 13, 2014

(86) PCT No.: PCT/EP2014/074535
§ 371 (c)(1),
(2) Date: May 3, 2016

(87) PCT Pub. No.: WO2015/071379
PCT Pub. Date: May 21, 2015

(65) Prior Publication Data
US 2016/0285236 A1    Sep. 29, 2016

(30) Foreign Application Priority Data

Nov. 13, 2013 (EP) .................................. 13192702

(51) Int. Cl.
*H01S 5/062* (2006.01)
*H01S 5/00* (2006.01)
(Continued)

(52) U.S. Cl.
CPC ........ *H01S 5/06216* (2013.01); *H01S 5/0057* (2013.01); *H01S 5/1039* (2013.01);
(Continued)

(58) Field of Classification Search
CPC .. H01S 5/06216; H01S 5/0057; H01S 5/1039; H01S 5/1042; H01S 5/18366; H01S 3/105–3/1055
See application file for complete search history.

(56) References Cited

U.S. PATENT DOCUMENTS 5,548,603 A * 8/1996 Calvani ................. H01S 5/0014
372/20
6,345,059 B1 * 2/2002 Flanders ................. H01S 5/141
372/19
(Continued)

FOREIGN PATENT DOCUMENTS

CA    2878975 A1 * 1/2014 ......... H01S 5/18355
EP    2 525 450 A1   11/2012
(Continued)

OTHER PUBLICATIONS

Ansbæk, Thor et al., "Resonant MEMS Tunable VCSEL", IEEE Journal of Selected Topics in Quantum Electronics, Jul./Aug. 2013, vol. 19, No. 4.
(Continued)

*Primary Examiner* — Joshua King
(74) *Attorney, Agent, or Firm* — Knobbe Martens Olson & Bear LLP

(57) ABSTRACT

There is presented a method of for generating a compressed optical pulse (112) comprising emitting from a wavelength tunable microcavity laser system (102), comprising an optical cavity (104) with a mechanically adjustable cavity length (L), a primary optical pulse (111) having a primary temporal width (T1) while adjusting the optical cavity length (L) so that said primary optical pulse comprises temporally separated photons of different wavelengths, and transmitting said pulse through a dispersive medium (114), so as to generate a compressed optical pulse (112) with a secondary temporal
(Continued)

width (T2), wherein the secondary temporal width (T2) is smaller than the primary temporal width (T1).

18 Claims, 10 Drawing Sheets

(51) Int. Cl.
  *H01S 5/183* (2006.01)
  *H01S 5/10* (2006.01)
  *H01S 3/105* (2006.01)
  *H01S 5/50* (2006.01)

(52) U.S. Cl.
  CPC ........ *H01S 5/1042* (2013.01); *H01S 5/18366* (2013.01); *H01S 3/105* (2013.01); *H01S 5/50* (2013.01)

(56) References Cited

U.S. PATENT DOCUMENTS

| | | | |
|---|---|---|---|
| 2002/0150130 A1* | 10/2002 | Coldren | H01S 5/18305 372/20 |
| 2006/0092993 A1* | 5/2006 | Frankel | H01S 3/105 372/18 |
| 2007/0183643 A1* | 8/2007 | Jayaraman | A61B 3/102 382/131 |
| 2008/0159468 A1* | 7/2008 | Chong | A61B 5/0066 378/4 |
| 2011/0292954 A1* | 12/2011 | Stoev | H01S 3/105 372/20 |
| 2012/0008658 A1* | 1/2012 | Chung | H01S 5/10 372/45.01 |
| 2013/0230064 A1 | 9/2013 | Tanaka et al. | |
| 2014/0253925 A1* | 9/2014 | Sekiguchi | G01B 9/02091 356/479 |
| 2015/0049341 A1* | 2/2015 | Fujii | H01S 5/18366 356/479 |

FOREIGN PATENT DOCUMENTS

| | | | |
|---|---|---|---|
| WO | WO 2012/149497 A2 | 11/2012 | |
| WO | WO 2014023777 A2 * | 2/2014 | ........... H01S 5/0222 |
| WO | WO 2014191005 A1 * | 12/2014 | ......... H01S 5/18316 |

OTHER PUBLICATIONS

Eigenwillig, Christoph Martin, "New rapidly wavelength-swept light sources for optical coherence tomography and picosecond pulse generation", Ph.D. thesis, Ludwig-Maximilians-Universität München, 2012, pp. 1-162.

Filios, Adam et al., "Transmission Performance of a 1.5μm 2.5-Gb/s Directly Modulated Tunable VCSEL", IEEE Photonics Technology Letters, Apr. 2003, pp. 599-601, vol. 15, No. 4.

Goeman, S. et al., "First demonstration of highly reflective and highly polarization selective diffraction gratings (GIRO-gratings) for long-wavelength VCSELs", IEEE Photonics Technology Letters, Sep. 1998, pp. 1205-1207 vol. 10, No. 9.

Jayaraman, V. et al, "Design and performance of broadly tunable, marrow line-width, high repetition rate 1310 nm VCSELs for swept source optical coherence tomography", Proc. of SPIE, 2012, pp. 82760D-1-82760D-11, vol. 8276.

Jayaraman, V. et al., "High-sweep-rate 1310 nm MEMS-VCSEL with 150 nm continuous tuning range", Electronics Letters, Jul. 5, 2012, pp. 867-869, vol. 48, No. 14.

Sarukura, Nobuhiko et al. "Compression of intra-cavity chirped pulses from a CW passive mode-locked Ti:Sapphire laser", Optics Communications, Jun. 1, 1990, pp. 49-52, vol. 77, No. 1.

Todor, Horatiu-Sebastian "Numerical and analytical modelling of Fourier domain mode-locked lasers", Ph.D. thesis, Technische Universität München, Lehrstuhl Für Nanoelektronik, 2012.

Yvind, Kresten et al., "Semiconductor Mode-Locked Lasers for Optical Communication Systems", Ph.D. thesis, 2003, Center for Communication, Optics and Materials, Technical University of Denmark.

International Search Report for PCT/EP2014/074535 dated Mar. 18, 2015.

* cited by examiner

METHOD FOR GENERATING A COMPRESSED OPTICAL PULSE

CROSS REFERENCE TO RELATED APPLICATIONS

This application is a U.S. National Phase Application of PCT International Application Number PCT/EP2014/074535, filed on Nov. 13, 2014, designating the United States of America and published in the English language, which is an International Application of and claims the benefit of priority to European Patent Application No. 13192702.2, filed on Nov. 13, 2013. The disclosures of the above-referenced applications are hereby expressly incorporated by reference in their entireties.

FIELD OF THE INVENTION

The present invention relates to a method for providing optical pulses, more specifically the invention relates to a method for generating a compressed optical pulse, an optical pulse system for generating a compressed optical pulse and use of an optical pulse system for generating a compressed optical pulse.

BACKGROUND OF THE INVENTION

Systems for generating short optical pulses may be applied for a number of applications where short pulses may be very interesting, such as telecommunications, non-linear optics or ultraprecise measurements of various kinds.

The reference "*Ultrafast Optics*", Andrew Weiner, Wiley 2009, ISBN: 978-0-471-41539-8 describes in chapter I short pulse generation via mode-locking.

An improved system for generating a compressed optical pulse would be advantageous, such as a system which is simpler and/or more flexible and/or a system for generating shorter, more intense and/or more temporally compressed optical pulses.

SUMMARY OF THE INVENTION

It may be seen as an object of the present invention to provide a method for generating a compressed optical pulse, an optical pulse system for generating a compressed optical pulse and use of an optical pulse system for generating a compressed optical pulse which may achieve one or more of the advantages outlined above.

It is a further object of the present invention to provide an alternative to the prior art.

Thus, the above described object and several other objects may be obtained in a first aspect of the invention by providing a method for generating a compressed optical pulse (112), the method comprising:
providing a wavelength tunable microcavity laser system (102) having a reference wavelength corresponding to a central operating wavelength, comprising
an optical cavity (104) with a mechanically adjustable cavity length (L), so as to enable the wavelength tunable microcavity laser system to emit photons of different wavelengths with respect to each other, wherein
the optical cavity comprises a microcavity wherein the length of the microcavity is at least ½ times the reference wavelength and less than 10 times the reference wavelength,
and wherein
the optical cavity (104) comprises a MEMS component and wherein a position of the MEMS component is adjustable and wherein the cavity length (L) of the optical cavity (104) depends on the position of the MEMS component so that a cavity controller (108a) may control the cavity length (L) of the optical cavity by controlling the position of the MEMS component,
a photon emitter (106) for emitting photons into the optical cavity,
a cavity controller (108a) arranged for controlling the length of the optical cavity, such as mechanically controlling the length of the optical cavity, such as mechanically controlling the geometrical length of the optical cavity,
providing a dispersive medium (114),
emitting a primary optical pulse (111) having a primary temporal width (T1) from the wavelength tunable microcavity laser system (102),
adjusting, such as mechanically adjusting, the optical cavity length (L) so that said primary optical pulse comprises temporally separated photons of different wavelengths,
receiving the primary optical pulse (111) with the dispersive medium (114), and
re-emitting the primary optical pulse from the dispersive medium as a compressed optical pulse (112) with a secondary temporal width (T2),
wherein the secondary temporal width (T2) is smaller than the primary temporal width (T1),
and wherein the step of
adjusting the optical cavity length (L) so that said primary optical pulse comprises temporally separated photons of different wavelengths,
further comprises adjusting the position of the MEMS component, such as adjusting the position of the MEMS component during emission of photons from the photon emitter (106) into the optical cavity.

In an alternative embodiment, there is presented a method for generating a compressed optical pulse, the method comprising:
providing a wavelength tunable microcavity laser system, comprising
an optical cavity with a mechanically adjustable cavity length (L), so as to enable the wavelength tunable microcavity laser system to emit photons of different wavelengths with respect to each other,
a photon emitter, such as a gain medium, for emitting photons into the optical cavity,
a cavity controller, such as a waveform generator, such as a waveform generator operably connected to the optical cavity, arranged for controlling the length of the optical cavity,
providing a dispersive medium,
emitting a primary optical pulse having a primary temporal width (T1) from the wavelength tunable microcavity laser system,
adjusting the optical cavity length (L) so that said primary optical pulse comprises temporally separated photons of different wavelengths, such as corresponding to the optical cavity length,
receiving the primary optical pulse with the dispersive medium, and
re-emitting the primary optical pulse from the dispersive medium as a compressed optical pulse with a secondary temporal width (T2), wherein the secondary temporal width (T2) is smaller than the primary temporal width (T1).

It may be understood that the method steps are not necessarily carried out in the order in which they are listed. For example, the step of 'emitting a primary optical pulse having a primary temporal width (T1) from the wavelength tunable microcavity laser system', may be carried out subsequent to the step of 'adjusting the optical cavity length (L) so that said primary optical pulse comprises temporally separated photons of different wavelengths, such as corresponding to the optical cavity length'. Thus, these two steps may be carried out by adjusting the optical cavity length (L) so that a primary optical pulse comprises temporally separated photons of different wavelengths, such as corresponding to the optical cavity length, and subsequently emitting said primary optical pulse having a primary temporal width (T1) from the wavelength tunable microcavity laser system.

The invention may be particularly, but not exclusively, advantageous for enabling temporally compressing pulses, so that the energy in a pulse may be compressed temporally into a shorter pulse with higher peak intensity. It may furthermore be seen as a possible advantage, that the present invention may enable shaping one or more pulses to specific purposes, e.g., it may enable generating multiple pulses, which in turn may enable, e.g., pump-probe experiments where a primary optical pulse corresponds to a compressed optical pulse comprising a pulse package (such as a compressed optical pulse comprising a plurality of optical pulses) enabling pump-probe experiments, which may be advantageous because it renders it superfluous to generate the plurality of optical pulses by a two-step method of first splitting a single pulse into two branches and subsequently delaying one of them.

A possible advantage of the MEMS component and the microcavity, may be that different degrees of wavelength tuning may be applied to different parts of the primary optical pulse via the MEMS component since the microcavity enables significantly changing (e.g., by at least 1% with respect to the reference wavelength) said wavelengths of said different parts of the optical pulse (while avoiding mode-hopping). This in turn enables that the distinguishing features enable dramatically increasing a ratio between a peak power of the compressed optical pulse divided by the average power of the compressed optical pulse, and a peak power of the primary optical pulse divided by the average power of the primary optical pulse.

The reference "*Ultrafast Optics*", Andrew Weiner, Wiley 2009, ISBN: 978-0-471-41539-8, which is hereby incorporated by reference in entirety, may be seen as describing generation of short pulses through mode-locking of lasers, possibly followed by extra non-linear spectral broadening and compression. The present invention may be seen as advantageous in that it provides a method for generating a compressed optical pulse and an optical pulse system for generating a compressed optical pulse which in a relatively simple, yet effective, manner may enable controlling the secondary temporal width and/or a repetition rate between a plurality of compressed optical pulses and/or the spectrum. It may furthermore be seen as an advantage of the present invention, that control over the secondary temporal width and/or a repetition rate between a plurality of compressed optical pulses and/or the spectrum may be obtained by changing the procedures of operation of the optical pulse system, such as said control may be obtained via electrical (such as purely electrical) means, such as enables said control without necessitating changing tangible components of the system.

The present invention may be seen as relying on the basic insight made by the inventor, that the tuning mechanism in a two-mirror microcavity laser is the doppler shift from the moving mirror. This means that the emitted light is coherent between frequencies as the laser line is dragged spectrally instead of building up from spontaneous emission. This allows manipulating a light pulse, so as to obtain "temporally separated photons of different wavelengths", and subsequently sending the manipulated light pulse through a dispersive medium, whereby it is possible to obtain a light pulse with highly desirable properties.

It may be understood, that the steps of the method are not necessarily executed in the order in which they are listed.

By a 'compressed optical pulse' may be understood a pulse which originates from a previous pulse (such as the primary optical pulse), where the previous pulse comprised temporally separated photons (such as temporally separated photons of different wavelengths), and wherein those temporally separated photons are less temporally separated in the compressed optical pulse. It may be understood that the 'compressed optical pulse' may have any shape, and may for example refer to a pulse package. In an embodiment, the compressed optical pulse is a pulse, such as a single pulse, of substantially Gaussian shape, such as of Gaussian shape.

By 'pulse package' is understood a single pulse with a shape wherein portions with non-zero intensity distribution are separated by a portion with substantially zero, such as zero, intensity. The temporal separation between portions (within a pulse package) with non-zero intensity distribution may be on the order of 1-100 picosecond, such as within 1-10 picosecond. It may be noted that for a plurality of pulse packages, the temporal separation between two pulse packages may be on the order of 1 nanosecond or larger than 1 nanosecond.

By a 'primary optical pulse' may be understood a pulse which is emitted or may be emitted from the 'wavelength tunable microcavity laser system'. It may be understood that the primary optical pulse may be understood to be emitted directly from the optical cavity or may be emitted via one or more optical elements belonging to the 'wavelength tunable microcavity laser system', such as an optical amplifier. It may be understood that the 'primary optical pulse' may have any shape, and may for example refer to a pulse package. In an embodiment, the primary optical pulse is a pulse, such as a single pulse, of substantially Gaussian shape, such as of Gaussian shape.

It is noted, that the optical pulses, which may be referred to by 'optical pulse emitted from the photon emitter', 'optical pulse in the optical cavity', 'optical pulse emitted from the optical cavity', 'primary optical pulse', 'compressed optical pulse', may be the same pulse, such as the same pulse at different spatial and or temporal positions. For example, the 'primary optical pulse' and the 'compressed optical pulse' may be the same pulse in the sense that the 'compressed optical pulse' comprises photons originating from the 'primary optical pulse', but may be different pulses in the sense that the temporal and spatial arrangement of the photons of various wavelengths of the primary optical pulse is different with respect to the temporal and spatial arrangement of the photons of various wavelengths of the compressed optical pulse (due to the passage through the dispersive medium).

By a 'wavelength tunable microcavity laser system' may be understood a system enabling emission of photons in the form of LASER light, wherein the wavelength of the photons may be controllably adjusted. The system may comprise an optical microcavity.

By a 'microcavity' may be understood an optical cavity, such as a two-mirror cavity, such as a cavity bounded by only 2 mirrors. It may be understood, that the wavelength tuning may be realized via moving at least one of the two mirrors, such as moving one and only one of the two mirrors or moving both of the two mirrors, so as to change an optical path length between the two mirrors. It may be understood that the optical path length between the two mirrors is relatively short, such as less than 100 times the reference wavelength, such as less than 10 times the reference wavelength, such as within ½-10 times the reference wavelength, such as within 0.75-7.5 times the reference wavelength, such as within 1-5 times the reference wavelength, such as within 2-5 times the reference wavelength. It terms of the geometrical distance between the two mirrors, the distance may be less than 100 micrometers, such as less than 50 micrometers, such as less than 10 micrometers, such as within 0.1-100 micrometers, such as within 0.1-50 micrometers, such as within 0.1-10 micrometers, such as within ½-10 micrometers, such as within 1-5 micrometers, such as within 1.5-3 micrometers. It may be understood, that the photon emitter, such as a gain medium, is placed inside the optical cavity, such as the photon emitter being intersected by an optical path between the two mirrors. It may in general be understood, that 'cavity' and 'microcavity' may be used interchangeably in the context of the present application. It may in general be understood, that only a few optical modes or a single-optical mode exist in a microcavities in the direction of propagation (longitudinal modes). By a few optical modes may be understood 10 optical modes or less, such as 5 optical modes or less, such as 3 optical modes or less, such as 2 optical modes or less, such as only 1 optical mode. The microcavity may be understood to be a planar microcavity in which two mirrors, such as two flat mirrors are brought into close proximity so that only a few wavelengths of light or no more than a few wavelengths of light can fit in between them. It may in general be understood, that an optical microcavity is a structure formed by reflecting faces on the two sides of a spacer layer or optical medium. It is often only a few micrometers thick, the spacer layer sometimes even in the nanometer range. As with common lasers this forms an optical cavity or optical resonator, allowing a standing wave to form inside the spacer layer. The thickness of the spacer layer determines the so-called "cavity-mode", which is the one wavelength that can be transmitted and will be formed as standing wave inside the resonator.

When referring to (optical) 'mode(s)' in the present application, it is generally understood to be longitudinal mode(s) (which may also be referred to in the literature as axial mode(s)), i.e., mode(s) along the cavity direction. For completeness, it is noted that multiple transverse modes may be possible (including unconfined modes) but by proper current injection or by introducing losses for higher order modes it can be ensured that only one transverse modes laser.

An advantage of having a microcavity may be, that the microcavity enables supporting only a few optical modes or only one optical mode. When referring to supported modes, it is understood to be modes supported by the cavity which are within the bandwidth of the gain medium, such as the wavelength range where the gain medium exhibit more stimulated emission than stimulated absorption. In the limiting case of only one longitudinal mode the laser will not be able to switch between modes (mode hopping) and there will therefore be a monotonic relation between the wavelength of the emitted laser light and the length of the cavity. For a few supported modes, such as equal to or less than 10, 5, 3 or 2, there will also be a monotonic relation between the wavelength of the emitted laser light and the length of the cavity within a wavelength range approximately given by the free spectral range. The free spectral range of an optical resonator (cavity) is the frequency spacing of its axial resonator modes. It is therefore also called axial mode spacing. The use of a microcavity thus avoids "mode hops" and limited tunability arising from a small free spectral range of a longer the cavity. A short cavity is a prerequisite for a wide tunability resulting in wide bandwidth of the primary pulse and short duration of the compressed pulse.

Another possible advantage of having a microcavity may be, that the limited cavity length enables adjusting the frequency of the pulses emitted to a larger degree via mechanically adjusting the cavity length. This is due to the fact that the change in frequency scales proportionally with the change in cavity length and inversely proportionally with the cavity length. Therefore, for a given mechanical adjustment, such as a mechanical adjustment which is realistic via a MEMS element, the change in frequency is larger for a microcavity compared to a macrocavity. In other words, the dimensions of a microcavity are comparable to the dimensions of realistic changes with MEMS elements, which enables significant changes to the dimensions of the cavity length of a microcavity via a MEMS element. This in turn enables that a synergistic effect can be reached by a combination of a microcavity and a MEMS element, because a MEMS element enables significantly changing the wavelength of a microcavity based LASER, where significant changes of the wavelength may be understood to be at least 1%, such as at least 2%, such as at least 5%, such as at least 10%, such as at least 15%, such as at least 20%, such as the percentage changes being given in relation to the reference wavelength.

By 'an optical cavity' is to be understood as is known in the art, and describes an arrangement of mirrors that forms a standing wave cavity resonator for light waves.

By a 'mechanically adjustable cavity length' may be understood that the cavity length may be changed mechanically, such as by physically changing the position of one or more tangible elements. In embodiments, the cavity length may be changed electro-mechanically, such as micro-electro-mechanically.

When referring to 'cavity length', which is used interchangeably with optical cavity length, which is used interchangeably with 'length of the optical cavity', it is understood to be the optical path length (OPL) for a single pass through the cavity, such as the optical path length between the two mirrors (i.e., first and second mirror). A roundtrip path length may be twice for these linear cavities, and will be twice for a cavity consisting of two mirrors. In an embodiment, the optical cavity is defined by two mirrors, such as no more than two mirrors.

By 'emit photons of different wavelengths with respect to each other' may be understood emitting at least two photons, wherein the at least two photons have different wavelengths with respect to each other.

By 'photon emitter' may be understood an entity capable of emitting photons, such as capable of emitting photons upon receipt of photons or electrons. Exemplary photon emitters may in general include an optical gain medium (such as laser gain medium). The photon emitter may in some embodiments comprise one or more quantum wells, quantum wires or quantum dots. In a particular embodiment, the photon emitter comprises a semiconductor material, such as a semiconductor in bulk form or in the form of one or more quantum wells, quantum wires or quantum dots.

By 'a gain medium' may be understood as is common in the art, such as the gain medium being an optical amplifier which coherently amplifies light passing through it.

By 'a cavity controller' may be understood a controlling unit which enables controlling the cavity length, such as the cavity controller being an electrical waveform generator operably connected to the optical cavity, such as operably connected to an actuator which enables controlling the cavity length. It may in general be understood, that the cavity controller controls or is arranged for controlling the cavity length after emission of photons from the photon emitter into the cavity, such during emission of photons from the photon emitter into the cavity. The cavity controller may be operationally connected to the photon emitter, so as to enable that the cavity controller is activated during emission of photons from the photon emitter into the cavity. The cavity controller may be operationally connected to the photon emitter, e.g., by:

having a computer controlling both the photon emitter and the cavity controller, or by operating the cavity controller with a trigger which is triggered by the photon emitter or a signal to the photon emitter.

Having the cavity controller operationally connected to the photon emitter may be advantageous for synchronizing the photon emitter and the cavity controller, which may in particular be advantageous when operating the photon emitter in a non-constant manner, such as when the photon emitter is supplied with a non-constant current.

By a 'dispersive medium' may be understood a medium wherein the period of time it takes for light having a certain frequency to propagate from an entry point in the dispersive medium to an exit point in the dispersive medium may be different compared with the period of time it takes for light having another certain frequency to propagate from the entry point in the dispersive medium to the exit point in the dispersive medium light. It may be understood that the dispersive medium is a medium wherein light having a certain frequency may travel with a different speed and/or along a different path compared with light having another certain frequency. It may be understood, that the speed of light and/or the path of light in a dispersive medium may depend on the frequency of the light. It may be understood that the dispersive medium may comprise, such as encompasses, a plurality of dispersive media, e.g., a plurality of serially connected dispersive media, such as dispersive media chosen from optical fibers and/or grating compressors. The dispersive medium or part of the dispersive medium may be made from components where different wavelengths may travel at different speeds. The dispersive medium or part of the dispersive medium may be made from components where different wavelengths experience a different physical path length, such as in a grating compressor comprising two opposing diffraction gratings and/or a chirped fiber bragg grating.

In a specific embodiment, the characteristics of the dispersive medium, enables that a compressed optical pulse may be generated from a primary optical pulse which is generated by controlling the length of the optical cavity, such as actuating the MEMS component, in a substantially sinusoidal manner, such in a sinusoidal manner. An advantage of this embodiment may be that it has relatively low requirements to the control over the optical cavity, such as enables resonant movement of, e.g., the MEMS component.

By a 'a temporal width' may be understood full width at half maximum (FWHM), as is common in the art.

By 'adjusting the optical cavity length so that said primary optical pulse comprises temporally separated photons of different wavelengths' may be understood that prior to emission of the primary optical pulse, during a period of time where the primary optical pulse may be described as being within the optical cavity, the length of the optical cavity is adjusted so that the doppler shift from the moving mirror causes wavelengths of some part of the pulse, such as only some part of the primary optical pulse, to change, such as significantly change (e.g., by at least 1% with respect to the reference wavelength). It is understood, that 'adjusting the optical cavity length so that said primary optical pulse comprises temporally separated photons of different wavelengths' entails (such as is carried out so) that the wavelengths within different parts of the primary optical pulse are changed to a different degree with respect to each other, such as changed to a significant different degree with respect to each other. It may be understood that said 'adjusting the optical cavity length so that said primary optical pulse comprises temporally separated photons of different wavelengths' significantly changes the degree to which frequencies of different parts of the primary optical pulse are changed with respect to each other. It may be seen as an advantage, that for said part of the pulse (with a new wavelength), the new wavelength is corresponding to (and/or in resonance with) the optical cavity length. It is readily understood by the skilled person that the wavelength corresponds to the optical cavity length, such as corresponds to two (2) times 'the optical cavity length' divided by an integer, where the integer may be 1 or an integer larger than 1, such as an integer larger than 2, 3, 4, 5, 6, 7, 8, 9, 10, 50, 100 or 1000.

By a 'receiving the primary optical pulse with the dispersive medium' may be understood that the primary optical pulse enters into the dispersive medium.

By a 're-emitting the primary optical pulse from the dispersive medium' may be understood that the primary optical pulse exits the dispersive medium.

In another embodiment, there is provided a method wherein the temporally separated photons of different wavelengths within the primary optical pulse are temporally coherent with each other, wherein temporally coherent may be understood as meaning that the relative temporal phase of the two optical fields are not random, such as meaning that there is a fixed phase relationship between the electric field values at different times.

'Temporal coherence' is understood as is known in the art as a fixed phase relationship between the electric field values at different times.

A possible advantage of having the separated photons being coherent, such as temporally coherent, may be, that it enables them to interfere constructively when temporally compressed in the compressed optical pulse.

In an embodiment, there is provided a method for generating a compressed optical pulse, wherein the step of adjusting the optical cavity length (L) so that said primary optical pulse comprises temporally separated photons of different wavelengths, such as adjusting the position of the MEMS component during an emission of photons from the photon emitter (106) into the optical cavity, comprises moving a mirror forming a boundary at one end of the optical cavity whereby a doppler shift from the moving mirror causes wavelengths of some part of the pulse, such as the primary optical pulse, such as only some part of the primary optical pulse, to change, such as significantly change (e.g., by at least 1% with respect to the reference wavelength).

An advantage of this embodiment may be, that the doppler shift enables the photons within different parts of the primary optical pulse are coherent with each other.

In an embodiment, there is provided a method for generating a compressed optical pulse, wherein the optical cavity comprises a microcavity wherein the photon emitter is placed inside the microcavity. It may be understood, that the photon emitter, such as a gain medium, is placed inside the optical cavity, such as the photon emitter being intersected by an optical path between the two mirrors. An advantage thereof may be, that it facilitates the stimulated emission of light in the microcavity, such as facilitates the laser principle in the microcavity.

In an embodiment, there is provided a method for generating a compressed optical pulse, wherein the optical cavity comprises a microcavity wherein the length of the microcavity is at least ½ times the reference wavelength and less than 10 times the reference wavelength. An advantage of having the length within this interval may be that the it enables having a relatively simple and efficient source of light with the reference wavelength and simultaneously enabling having relatively large tuning efficiency and free spectral range. In an embodiment, there is provided a method for generating a compressed optical pulse, wherein the optical cavity comprises a microcavity wherein the length of the microcavity is at least ½ times the reference wavelength and less than 100 times the reference wavelength. In an embodiment, there is provided a method for generating a compressed optical pulse, wherein the optical cavity comprises a microcavity wherein the length of the microcavity is at least 1 times the reference wavelength, such as larger than 1 times the wavelength, and less than 10 times the reference wavelength. In an embodiment, there is provided a method for generating a compressed optical pulse, wherein the optical cavity comprises a microcavity wherein the length of the microcavity is at least 1 times the reference wavelength and less than 100 times the reference wavelength.

In another embodiment, there is provided a method for generating a compressed optical pulse, wherein the primary optical pulse is emitted so that the spectral distribution of the primary optical pulse, such as of the individual primary optical pulse, may be described by a continuous function.

A possible advantage may be, that it enables compressing more light (more wavelengths) in to the compressed optical pulse, e.g., as opposed to a spectrum with discrete peaks of wavelengths, i.e., wherein parts of the spectrum have zero or near-zero intensity. A possible advantage of having the spectral distribution of the primary optical pulse being described by a continuous function, may be that it enables having higher energy in the pulse for a given maximum power, compared to a pulse where the distribution is non-continuous. It may be understood that for a plurality of primary optical pulses, such as a plurality of periodically emitted optical pulses, such as a pulse train of primary optical pulses, it may be possible to get a modulation corresponding to the inverse of the the pulse repetition rate in which case it may possible to get discontinuous, such as discrete, lines in the spectral distribution.

By a 'spectral distribution' may be understood a function describing the intensity as a function of wavelength.

In another embodiment, there is provided a method for generating a compressed optical pulse, wherein the primary optical pulse is emitted so that the spectral distribution of the primary optical pulse may be described, such as is described, by a function which does not have wavelength regions with non-zero intensity which are separated by one or more wavelength regions which have substantially zero, such as zero, intensity.

In another embodiment, there is provided a method for generating a compressed optical pulse, wherein the primary optical pulse is emitted so that the temporally resolved spectral distribution of the primary optical pulse may be described, such as is described, by a continuous function.

This may be advantageous since it may enable that the different parts of the primary optical pulse, with different wavelengths with respect to each other, are still temporally coherent. Another possible advantage may be, that it enables compressing more light (more wavelengths) in to the compressed optical pulse.

A possible advantage of having the temporally resolved spectral distribution of the primary optical pulse being described by a continuous function, may be that it enables having higher energy in the pulse for a given maximum power, compared to a pulse where the distribution is non-continuous. Another advantage may be, that it facilitates coherence between the various wavelengths of the pulse. By a 'temporally resolved spectral distribution' may be understood a function describing the instantaneous wavelength as a function of time, such as wavelength as a function of time. It may thus be understood, that when the temporally resolved spectral distribution may be described by a continuous function, the wavelength does not change abruptly with time.

In another embodiment, there is provided a method for generating a compressed optical pulse, wherein the optical cavity comprises a MEMS component and wherein a position of the MEMS component is adjustable, such as controllably adjustable, and wherein the cavity length of the optical cavity depends on the position of the MEMS component so that the cavity controller may control the cavity length of the optical cavity by controlling the position of the MEMS component, and wherein the step of adjusting the optical cavity length so that said primary optical pulse comprises temporally separated photons of different wavelengths, such as corresponding to the optical cavity length, further comprises adjusting the position of the MEMS component.

By 'MEMS' is in general understood microelectro-mechanical system. However, it may be understood, that 'MEMS' functions as adjective and may thus be seen as describing a type of component which may function as a component in a microelectro-mechanical system. It may thus be understood that in the present embodiment, the optical cavity comprises a component which may be actuated via micro-electro-mechanical interactions and thus be part of an implied microelectro-mechanical system.

By 'microelectro-mechanical system' may be understood a system with dimensions in the micrometer region which may be mechanically actuated by applying electrical forces, such as via coulomb interactions or piezoelectric actuation.

By 'the optical cavity comprises a MEMS component' may be understood, that the optical cavity with a mechanically adjustable cavity length (L) may be delimited by a MEMS component, such as one of the mirrors defining the optical cavity may be a MEMS component or may be mounted on a MEMS component.

This may be advantageous since MEMS facilitates changing the cavity length in a simple yet effective and controllable manner.

In another embodiment, there is provided a method for generating a compressed optical pulse, wherein the method further comprises shaping of the primary optical pulse, by temporally varying emission of photons from the photon emitter (106), such as temporally varying a power supplied to the photon emitter from a photon emitter controller and/or temporally varying a supply of photons (such as high-energy photons) to the photon emitter, so that the primary optical pulse may be described by a primary shape.

By 'shaping of the primary optical pulse' may be understood temporal shaping of the optical pulse, such as changing the pulse so that a shape of a function depicting the intensity of one or more or all of the wavelengths of the pulse with respect to time changes.

This may be advantageous since the properties of the compressed optical pulse may depend on the primary shape of the primary optical pulse, and hence shaping the primary optical pulse may enable optimizing the properties of the compressed optical pulse.

By 'temporally varying' may be understood that an entity is changed with respect to time, such as the value of the entity is different for different points in time.

In another embodiment, there is provided a method for generating a compressed optical pulse, wherein the method further comprises providing feedback information, and subsequently emitting a second primary optical pulse, where properties of the second primary optical pulse is based on said feedback information, such as providing said feedback information to the wavelength tunable microcavity laser system wherein the wavelength tunable microcavity laser system is arranged for subsequently emitting a second primary optical pulse where properties of the second primary optical pulse is based on said feedback information.

This may be advantageous since this allows for compensating for variations in the elements of the system, such as changes in the dispersive element and/or the micro-cavity emitter and/or the MEMS component. The feedback information can be used to set up the system to achieve the desired properties of the second pulse and to stabilize the system in time against, e.g., temperature changes or ageing.

By 'feedback information indicative of one or more properties of the compressed optical pulse' may be understood information regarding said properties of the compressed optical pulse, which may be used for controlling the the wavelength tunable microcavity laser system with a view to optimizing the properties of the compressed optical pulse. It may be understood that said one or more properties may refer to any one of
  secondary shape,
  secondary spectral distribution, and/or
  the secondary temporal width,
  of the compressed optical pulse.

By 'second primary optical pulse' may be understood a subsequent primary optical pulse which is emitted subsequent to a previous primary optical pulse, such as the previous primary optical pulse which was re-emitted as the compressed optical pulse for which the feedback information is indicative.

By 'properties of the second primary optical pulse' may for example be understood any one of
  secondary shape,
  secondary spectral distribution, and/or
  the secondary temporal width,
  of the second primary optical pulse.

By 'based on said feedback information' may be understood that the properties of the second primary optical pulse depends on the feedback information.

In another embodiment, there is provided a method for generating a compressed optical pulse, wherein a primary shape of the primary optical pulse is shaped by
  temporally varying an amplification of an optical amplifier wherein the wavelength tunable microcavity laser system further comprises the optical amplifier and/or by
  temporally varying an emission of photons from the photon emitter.

In another embodiment, there is provided a method for generating a compressed optical pulse, wherein the method further comprises
  receiving information regarding dispersion characteristics of the dispersive medium,
  arranging the primary optical pulse (111) with a primary shape and/or primary spectral distribution with respect to time which is tailored to the dispersion characteristics of the dispersive medium (114) so that the primary optical pulse is arranged so that the compressed optical pulse is optimized relative to a predetermined criterium.

In an alternative embodiment of the invention, there is provided a method for generating a compressed optical pulse (112), the method comprising:
  providing a wavelength tunable microcavity laser system (102), comprising
    an optical cavity (104) with an adjustable cavity length (L), so as to enable the wavelength tunable microcavity laser system to emit photons of different wavelengths with respect to each other,
    a photon emitter (106), such as a gain medium, for emitting photons into the optical cavity,
    a cavity controller (108*a*), such as a waveform generator, such as a waveform generator operably connected to the optical cavity, arranged for controlling the length of the optical cavity,
  providing a dispersive medium (114),
  emitting a primary optical pulse (111) having a primary temporal width (T1) from the wavelength tunable microcavity laser system (102),
  adjusting the optical cavity length (L) so that said primary optical pulse comprises temporally separated photons of different wavelengths, such as corresponding to the optical cavity length,
  receiving the primary optical pulse (111) with the dispersive medium (114), and
  re-emitting the primary optical pulse from the dispersive medium as a compressed optical pulse (112) with a secondary temporal width (T2),
  wherein the secondary temporal width (T2) is smaller than the primary temporal width (T1).

It may be understood that according to this embodiment, the optical cavity may have, e.g., an mechanically and/or electrooptically adjustable length.

According to a second aspect of the invention, there is provided an optical pulse system (100) for generating a compressed optical pulse (112) comprising:
  A wavelength tunable microcavity laser system (102) having a reference wavelength corresponding to a central operating wavelength, comprising
    an optical cavity (104) with a mechanically adjustable cavity length (L), so as to enable the wavelength tunable microcavity laser system to emit photons of different wavelengths with respect to each other, wherein
the optical cavity comprises a microcavity wherein the length of the microcavity is at least ½ times the reference wavelength and less than 10 times the reference wavelength,
and wherein
the optical cavity (104) comprises a MEMS component and wherein a position of the MEMS component is adjustable and wherein the cavity length (L) of the optical cavity (104) depends on the position of the MEMS component so that a cavity controller (108a) may control the cavity length (L) of the optical cavity by controlling the position of the MEMS component,
a photon emitter (106) for emitting photons into the optical cavity,
a cavity controller (108a) arranged for controlling the length (L) of the optical cavity (104), such as mechanically controlling the length of the optical cavity, such as mechanically controlling the geometrical length of the optical cavity,
where the wavelength tunable microcavity laser system (102) is being arranged for emitting a primary optical pulse (111) having a primary temporal width (T1), where the cavity controller (108a) is arranged for adjusting the optical cavity length (L) by adjusting the position of the MEMS component, such as being arranged for adjusting the position of the MEMS component during an emission of photons from the photon emitter (106) into the optical cavity, so that said primary optical pulse (111) comprises temporally separated photons of different wavelengths,
A dispersive medium (114) arranged for receiving the primary optical pulse (111), and for re-emitting the primary optical pulse as a compressed optical pulse (112) with a secondary temporal width (T2),
wherein the secondary temporal width (T2) is smaller than the primary temporal width (T1).

In an alternative embodiment, there is presented an optical pulse system (100) for generating a compressed optical pulse (112), the system comprising:
A wavelength tunable microcavity laser system (102), comprising
an optical cavity (104) with a mechanically adjustable cavity length (L), so as to enable the wavelength tunable microcavity laser system to emit photons of different wavelengths with respect to each other,
a photon emitter (106), such as a gain medium, for emitting photons into the optical cavity,
a cavity controller (108a), such as a waveform generator, arranged for controlling the length (L) of the optical cavity (104),
where the wavelength tunable microcavity laser system (102) is being arranged for emitting a primary optical pulse (111) having a primary temporal width (T1), where the cavity controller (108a) is arranged for adjusting the optical cavity length (L) so that said primary optical pulse (111) comprises temporally separated photons of different wavelengths, such as corresponding to the optical cavity length,
A dispersive medium (114) arranged for receiving the primary optical pulse (111), and for re-emitting the primary optical pulse as a compressed optical pulse (112) with a secondary temporal width (T2),
wherein the secondary temporal width (T2) is smaller than the primary temporal width (T1).

By 'an optical pulse system (100) for generating a compressed optical pulse' may in general by understood a system for generating a compressed optical pulse.

In another embodiment, there is provided an optical pulse system for generating a compressed optical pulse, where the cavity controller (108a) is arranged for moving a mirror forming a boundary at one end of the optical cavity whereby a doppler shift from the moving mirror causes wavelengths of some part of the pulse, such as the primary optical pulse, such as only some part of the primary optical pulse, to change, such as significantly change (e.g., by at least 1% with respect to the reference wavelength),
so as to be arranged for adjusting, such as adjusting the position of the MEMS component during an emission of photons from the photon emitter (106) into the optical cavity, the optical cavity length (L) by adjusting the position of the MEMS component, so that said primary optical pulse (111) comprises temporally separated photons of different wavelengths.

An advantage of this embodiment may be, that the doppler shift enables the photons within different parts of the primary optical pulse are coherent with each other.

In another embodiment, there is provided an optical pulse system for generating a compressed optical pulse, wherein the temporally separated photons of different wavelengths within the primary optical pulse are coherent with each other.

In another embodiment, there is provided an optical pulse system for generating a compressed optical pulse, wherein the system is arranged for emitting the primary optical pulse so that the spectral distribution of the primary optical pulse may be described by a continuous function.

In another embodiment, there is provided an optical pulse system for generating a compressed optical pulse, wherein the system is arranged for emitting an optical pulse emitted from the optical cavity so that the spectral distribution of the optical pulse emitted from the optical cavity may be described by a continuous function.

In another embodiment, there is provided an optical pulse system for generating a compressed optical pulse, wherein the system is arranged for emitting the primary optical pulse so that a temporally resolved spectral distribution of the primary optical pulse may be described, such as is described, by a continuous function.

In another embodiment, there is provided an optical pulse system for generating a compressed optical pulse, wherein the system is arranged for emitting an optical pulse emitted from the optical cavity so that a temporally resolved spectral distribution of the optical pulse emitted from the optical cavity may be described by a continuous function, such as is described by a continuous function.

In another embodiment, there is provided an optical pulse system for generating a compressed optical pulse, wherein the optical cavity comprises a microcavity wherein the photon emitter is placed inside the microcavity.

In another embodiment, there is provided an optical pulse system for generating a compressed optical pulse, wherein the optical cavity comprises a microcavity wherein the length of the microcavity is larger than 1 times the reference wavelength and less than 10 times the reference wavelength.

In another embodiment, there is provided an optical pulse system (100) for generating a compressed optical pulse (112), wherein the optical cavity (104) comprises a MEMS component and a position of the MEMS component is adjustable and wherein the cavity length (L) of the optical cavity (104) depends on the position of the MEMS component so that the cavity controller (108a) may control the cavity length (L) of the optical cavity by controlling the position of the MEMS component.

In another embodiment, there is provided an optical pulse system (100) for generating a compressed optical pulse (112), wherein the wavelength tunable microcavity laser system (102) further comprises an optical amplifier (116), such as an optical amplifier arranged in an optical path between the optical cavity and the dispersive medium, such as a semiconductor optical amplifier arranged in an optical path between the optical cavity and the dispersive medium.

This may be advantageous since the optical amplifier allows amplifying and/or shaping the pulse emitted from the optical cavity so as to control the shape of the primary optical pulse.

By 'optical amplifier' may in general be understood an element which may amplify and/or shape an optical pulse. In embodiments, the optical amplifier may perform a coherent (phase preserving) amplification of the optical field thereby changing the amplitude of the field. The optical amplifier may function by employing stimulated emission from excited atoms. The optical amplifier may increase the output power of the system significantly (e.g. 20 dB or 30 dB) beyond that of the microcavity laser, such as the pulse emitted from the optical cavity. It may also be understood that the optical amplifier may in embodiments decrease and/or increase the output power of the system. In an embodiment, the optical amplifier may completely "turn-off", such as suppress by more than 30 dB, transmission in periods of time. If the optical amplifier has a fast response to it's pumping mechanism, such as a semiconductor optical amplifier, it may furthermore be used to shape the temporal intensity profile of the pulse emitted from the optical cavity. This includes e.g. changing the length and shape of the pulse including e.g. extinguishing part of the emission from the microcavity laser. Examples of optical amplifiers include optical amplifiers from THORLABS, such as the optical amplifiers with part numbers BOA1004P, BOA1132P, BOA1137P (in October 2013). In an exemplary embodiment, there is provided an optical amplifier which is fast, such as so fast that fast modulation is possible, such as an optical amplifier without capacitors to stabilize current which normally limit the speed with with the gain can be varied. Another example of an optical amplifier is given by the optical amplifier from the manufacturer THORLABS with part number BOA1004PXS (in October 2013).

In another embodiment, there is provided an optical pulse system (100) for generating a compressed optical pulse (112), wherein a primary shape (121) of the primary optical pulse (111) may be shaped by temporally varying emission of photons from the photon emitter (106), such as temporally varying a power supplied to the photon emitter from a photon emitter controller (108b) and/or temporally varying a supply of photons (such as high-energy photons) to the photon emitter.

In an embodiment the photon emitter may be used for shaping the temporal intensity of the primary pulse.

In an embodiment, the photon emitter is kept above the lasing threshold (when emitting the pulse from which pulse the primary optical pulse originates, such as during a period of emitting the pulse from which pulse the primary optical pulse originates). A possible advantage thereof is that it enables retaining coherence.

In another embodiment, there is provided an optical pulse system (100) for generating a compressed optical pulse (112), wherein a primary shape (121) of the primary optical pulse (111) may be shaped by temporally varying an amplification of the optical amplifier (116), such as temporally varying a signal supplied to the optical amplifier from an optical amplifier controller (108c) and/or by temporally varying emission of photons from the photon emitter.

In another embodiment, there is provided an optical pulse system (100) for generating a compressed optical pulse (112), wherein the optical cavity (104) and photon emitter (106) is given by any one of: A Vertical Cavity Surface Emitting Laser (VCSEL), an in-plane emitting microcavity laser or an edge-emitting laser.

In an embodiment, the optical cavity is a linear cavity, such as a Fabry-Perot Cavity where the wavelength of the emitted light is proportional to the optical roundtrip distance between the mirrors divided by an integer. An advantage thereof it that it enables using the Doppler effect as the tuning mechanism.

In an embodiment, the the length of the optical cavity optical cavity is less than 1000 times the reference wavelength, such as less than 100 times the reference wavelength, such as less than 50 times the reference wavelength such as less than 25 times the reference wavelength such as less than 10 times the reference wavelength such as less than 5 times the reference wavelength. An advantage of having such small length of the optical cavity may be that the it enables having relatively large tuning efficiency and large free spectral range. In an embodiment having such small optical cavity length, the optical cavity is a linear optical cavity.

An advantage of using a VCSEL may be, that it is relatively simple to realize. Another advantage may be that it enables a large degree of coherence.

In another embodiment, there is provided an optical pulse system for generating a compressed optical pulse, wherein the wavelength tunable microcavity laser system is arranged for emitting the primary optical pulse (111) with a primary shape and/or primary spectral distribution with respect to time which is based on the dispersion characteristics of the dispersive medium.

An advantage of this embodiment may be, that it enables adapting the primary optical pulse according to the dispersion characteristics of the dispersive medium, so that different primary optical pulses may be provided for different dispersion characteristics of the dispersive medium. This may for example be advantageous for keeping the properties of the compressed optical pulse constant (even if the dispersion characteristics of the dispersive medium changes) and/or for optimizing the properties of the compressed optical pulse.

By 'based on the dispersion characteristics of the dispersive medium' may be understood, that the primary shape and/or primary spectral distribution with respect to time depends on, such as is affected by, the dispersion characteristics of the dispersive medium, or information indicative of the dispersion characteristics of the dispersive medium.

By 'dispersion characteristics of the dispersive medium' may be understood information regarding the refractive index n of the dispersive medium as a function of the frequency f of the light, such as n=n(f), or alternatively, with respect to the wave's wavelength n=n($\lambda$). The wavelength dependence of the dispersive medium's refractive index may in embodiments be quantified by its Abbe number or its coefficients in an empirical formula such as the Cauchy or Sellmeier equations. It may furthermore be understood, that information regarding the refractive index n of the dispersive medium may comprise both information regarding the wavelength dependence of the dispersive medium's refractive index and the length of the dispersive medium.

In another embodiment, there is provided an optical pulse system for generating a compressed optical pulse, wherein the wavelength tunable microcavity laser system is arranged for emitting the primary optical pulse (111) with a primary shape and/or primary spectral distribution with respect to time which is tailored to the dispersion characteristics of the dispersive medium.

By 'tailored to the dispersion characteristics of the dispersive medium' may be understood that the primary optical pulse is arranged so that the compressed optical pulse, which may be understood to correspond to the primary optical pulse subsequent to transmittal through the dispersive medium, may be optimized relative to a predetermined criterium. In an exemplary embodiment, the predetermined criterium may be, e.g., temporal compression, such as maximal temporal compression, of the compressed optical pulse.

It may be understood that in order to have 'a primary shape and/or primary spectral distribution' which are tailored to the the dispersion characteristics of the dispersive medium fine adjustments may be needed in order to actually optimize with respect to the predetermined criterion, such as to achieve maximum compression. In exemplary embodiments, the primary optical pulse may be shaped so as to have a certain shape, such as having a shape reminiscent of multiple pulses shortly after each other.

This may be advantageous since it enables optimizing the properties of the compressed optical pulse by ensuring that the properties of the primary optical pulse matches the dispersion characteristics of the dispersive medium.

In another embodiment, there is provided an optical pulse system for generating a compressed optical pulse, wherein the wavelength tunable microcavity laser system (102) is arranged for emitting the primary optical pulse (111) with a primary shape and/or primary spectral distribution with respect to time which is tailored to the dispersion characteristics of the dispersive medium (114) so that the primary optical pulse is arranged so that the compressed optical pulse is optimized relative to a predetermined criterium. By 'tailored to the dispersion characteristics of the dispersive medium' may be understood, that a primary shape and/or primary spectral distribution with respect to time is changed dependent on the characteristics of the dispersive medium, so that the primary optical pulse is arranged so that the compressed optical pulse is optimized relative to a predetermined criterium.

In another embodiment, there is provided an optical pulse system for generating a compressed optical pulse, wherein the wavelength tunable microcavity laser system is arranged for comprising and/or receiving information indicative of the dispersion characteristics of the dispersive medium. It may be understood that in order for said optical pulse system to be 'arranged for comprising information', the optical pulse system may comprise a physical medium on which the information is stored, such as a computer-readable storage medium, such as a magnetic storage medium, such as a hard disk drive (HDD) or a solid state drive (SSD), or an optical storage medium. It may be understood that in order for said system to be 'arranged for receiving information', the system may comprise a data interface, such as for example a USB port or a wireless interface.

In an embodiment, there is provided an optical pulse system for generating a compressed optical pulse, wherein the optical pulse system comprises
 a computer-readable storage medium being arranged for comprising information indicative of the dispersion characteristics of the dispersive medium, and/or
 a data interface arranged for receiving information indicative of the dispersion characteristics of the dispersive medium.

In an embodiment, there is provided an optical pulse system for generating a compressed optical pulse, wherein the optical pulse system comprises
 a computer-readable storage medium being arranged for comprising information indicative of the dispersion characteristics of the dispersive medium, and/or
 a data interface arranged for receiving information indicative of the dispersion characteristics of the dispersive medium,
 and wherein the wavelength tunable microcavity laser system (102) is arranged for emitting the primary optical pulse (111) with a primary shape and/or primary spectral distribution with respect to time which is based on the information indicative of the dispersion characteristics and tailored to the dispersion characteristics of the dispersive medium (114) so that the primary optical pulse is arranged so that the compressed optical pulse is optimized relative to a predetermined criterium. It may be understood, that according to this embodiment, the wavelength tunable microcavity laser system may be arranged for taking into account the dispersion characteristics of the dispersive medium, and accordingly adapt a primary shape and/or primary spectral distribution with respect to time of the primary optical pulse. This may be advantageous in that the primary optical pulse may then be optimized, such as repeatedly and/or continuously optimized, for the specific dispersive medium.

This may be advantageous since it enables emitting the primary optical pulse with a primary shape and/or primary spectral distribution with respect to time which is based on, such as tailored to, the dispersion characteristics of the dispersive medium. It may furthermore be advantageous in that it is enabling a user to adjust parameters, such via an ASIC and/or a laptop.

In an embodiment, the wavelength tunable microcavity laser system is further arranged for adapting the primary optical pulse based on the dispersion characteristics of the dispersive medium.

The characteristics of the dispersive medium may be understood as the dispersion as a function of wavelength and/or the length of the dispersive medium.

In another embodiment, there is provided an optical pulse system for generating a compressed optical pulse, wherein the wavelength tunable microcavity laser system is arranged for comprising and/or receiving information indicative of the properties of the compressed optical pulse. In a further embodiment, the wavelength tunable microcavity laser system is further arranged for adapting the primary optical pulse based on the information regarding the compressed optical pulse.

An advantage of this embodiment, may be that it enables a feedback system, which in turn enables adapting the primary optical pulse so as to improve the properties of the compressed optical pulse.

In another embodiment, there is provided an optical pulse system for generating a compressed optical pulse, wherein the optical pulse system further comprises a feedback system for providing feedback information indicative of one or more properties of the compressed optical pulse to the wavelength tunable microcavity laser system, and wherein the wavelength tunable microcavity laser system is arranged for subsequently emitting a second primary optical pulse, where properties of the second primary optical pulse is based on said feedback information.

In an embodiment, the feedback system may comprise a detector for measuring peak effect of the compressed optical pulse, such as a two-photon detector and a detector for measuring the average power. In an embodiment, the feedback system may comprise a feedback loop, such as a feedback loop relying on PID controlling.

In an embodiment, the second primary optical pulse may be changed with respect to a previous primary optical pulse in terms of one or more of wavelength sweep rate and duration.

By 'wavelength sweep rate' may be understood the rate with which the wavelengths in the primary optical pulse are changed. The change in wavelengths of the primary optical pulse may be due to adjustment of the optical cavity length (L) so that said primary optical pulse comprises temporally separated photons of different wavelengths, such as corresponding to the optical cavity length (where it is readily understood by the skilled person, that the wavelength corresponds to the optical cavity length, such as corresponds to two times 'the optical cavity length' divided by an integer). It may be understood, that the wavelength sweep rate may be measured in change of wavelengths pr. unit time, such as in units of nm/s. It may be understood that the rate of adjusting the length of the optical cavity (e.g., change in optical cavity length per unit time) and wavelength sweep rate (e.g., change of wavelengths pr. unit time) is not necessarily identical. For example, in case of a multiwavelength long cavity with length given by N (e.g., 2*cavity length=N*lambda, where lambda is the reference wavelength, and N is an integer>1), the so-called tuning efficiency is then 1/N, and the wavelength sweep rate is then given by 'the rate of adjusting the length of the optical cavity'/N.

In another embodiment, there is provided an optical pulse system (100) for generating a compressed optical pulse (112), wherein the Q-factor of the MEMS component is within the range from 10 to critically damped.

A possible advantage of having a low Q-factor may be that it enables controlling the movement of the MEMS component, which in turn enables controlling the characteristics of the first optical pulse, which in turn enables determining the characteristics of the compressed optical pulse. Another advantage of having low Q-factor may be that it enables faster settling times, i.e., less ringing.

In an embodiment, the Q-factor of the MEMS component is less than 100, such as less than 75, such as less than 50, such as less than 25, such as less than 20, such as less than 15, such as less than 10, such as less than 5, such as less than 1, such as less than 0.1. In an embodiment, the MEMS component is critically dampened.

In another embodiment, there is provided a wavelength tunable photon source which is arranged for emitting photons at a reference wavelength lambda wherein an optical path length (OPL) between the first mirror and the second mirror is less than 5 times lambda ($5 \times \lambda_0$), such as less than 2.5 times lambda ($2.5 \times \lambda_0$), such as less than 1.5 times lambda ($1.5 \times \lambda_0$). An advantage of a small OPL may be that it enables a relatively larger free spectral range and/or increased tuning efficiency.

In an embodiment there is provided an electrically pumped cavity length of less than 4 times lambda ($4 \times \lambda_0$), such as less than 2 times lambda ($2 \times \lambda_0$). In an embodiment there is provided an optically pumped cavity length of less than 3.5 times lambda ($3.5 \times \lambda_0$), such as less than 2.5 times lambda ($2.5 \times \lambda_0$), such as less than 1.5 times lambda ($1.5 \times \lambda_0$).

In another embodiment, there is provided a wavelength tunable photon source, wherein a resonance frequency of the first mirror, such as the MEMS component, is higher than 0.1 MHz, such as higher than 0.5 MHz, such as higher than 1 MHz, such as higher than 5 MHz, such as higher than 10 MHz, such as higher than 50 MHz, such as higher than 100 MHz. An advantage of such relatively high resonance frequency may be that it enables driving, i.e., moving, the first mirror at this relatively high frequency with relatively large amplitude at relatively little power consumption.

In another embodiment, there is provided an optical pulse system (100) for generating a compressed optical pulse (112), wherein
  a first ratio is given by peak power of the compressed optical pulse divided by the average power of the compressed optical pulse, such as the compressed optical pulse immediately after the dispersive medium, and
  a second ratio is given by peak power of the primary optical pulse divided by the average power of the primary optical pulse, such as the primary optical pulse immediately before the dispersive medium,
  and wherein the first ratio is at least a factor 10 larger than the second ratio, such as at least a factor 50 larger than the second ratio, such as at least a factor 100 larger than the second ratio, such as at least a factor 500 larger than the second ratio, such at least a factor 1000 (1e3) larger than the second ratio, such as at least a factor 5000 (5e3) larger than the second ratio, such as at least a factor 10000 (1e4) larger than the second ratio, such as at least a factor 50000 (5e4) larger than the second ratio, such as a factor at least a factor 100000 (1e5) larger than the second ratio, such as at least a factor 500000 (5e5) larger than the second ratio, such as at least a factor 550000 (5.5e5) larger than the second ratio, such as at least a factor 570000 (5.7e5) larger than the second ratio, such as a factor 570000 (5.7e5) larger than the second ratio.

This may be advantageous since it enables compressing a relatively low intensity spread across a relatively long period of time into a relatively high intensity in a relatively short period of time.

In an embodiment, the optical pulse system for generating a compressed optical pulse is arranged for generating a plurality of primary optical pulses, and a corresponding plurality of compressed optical pulses, such as each primary optical pulse corresponding to a compressed optical pulse, such as the primary optical pulses and the compressed optical pulses being emitted periodically. In a further embodiment, the duty cycle immediately before the dispersive medium is at least a factor a factor 10 larger than the duty cycle immediately after the dispersive medium, such as 50, such as 100, such as 500, such 1000, such as 5000, such as 10000, such as 50000, such as a factor 100000 larger than the duty cycle immediately after the dispersive medium. By duty cycle is understood the fraction of time that light is emitted, i.e., the system is in an active state, as a fraction of the total time under consideration. For a plurality of optical pulses, the duty cycle may thus be calculated as pulse width divided by the time period between pulses.

It may be understood that the optical pulse system for generating a compressed optical pulse may be arranged for generating a plurality of primary optical pulses by repetitively carrying out a step of adjusting the optical cavity length so that a primary optical pulse comprises temporally separated photons of different wavelengths. The period of time between emission of primary optical pulses within such plurality of primary optical pulses may be constant or non-constant. The period of time between emission of primary optical pulses within such plurality of primary optical pulses may be at least 1 nanosecond, such as between 5 nanoseconds and 10000 nanoseconds. The period of time between emission of primary optical pulses within such plurality of primary optical pulses may be controlled electrically, such as via an arbitrary waveform generator controlling the optical cavity length. The primary optical pulses within such plurality of primary optical pulses may be similar or non-similar. One or more primary optical pulses within such plurality of primary optical pulses may comprise a pulse package.

In an embodiment, the pulsewidth of the compressed optical pulse is less than 1 picosecond, such as less than 500 femtoseconds, such as less than 250 fs, such as less than 100 fs, such as less than 50 fs.

In an embodiment, the optical pulse system for generating a compressed optical pulse is arranged for generating a primary optical pulse comprising a pulse package, which corresponds to a single compressed optical pulse or a compressed optical pulse comprising a pulse package.

In an embodiment, the optical pulse system for generating a compressed optical pulse is arranged for generating a compressed optical pulse comprising a pulse package, such as the system being arranged for generating a single primary optical pulse or a primary optical pulse comprising a pulse package, and a corresponding compressed optical pulse comprising a pulse package. An advantage of this embodiment may be that it facilitates pump-probe experiments, such as facilitates pump-probe experiments in a one-step method wherein the primary optical pulse is split into two optical pulses (within the pulse package of the compressed optical pulse) and wherein the delay of the latter of the two pulses are realized in the same step, namely transmission through the dispersive medium. Another possible advantage may be that the distance between the pulses within the pulse package of the compressed optical pulse may be varied.

In another embodiment, there is provided an optical pulse system (100) for generating a compressed optical pulse (112),
wherein the optical pulse system (100) is arranged so that the different photons emitted from the wavelength tunable microcavity laser system (102) are arranged so that photons having a relatively long wavelength are emitted before photons having a relatively short wavelength, and wherein the dispersive medium (114) exhibits normal dispersion OR
wherein the optical pulse system (100) is arranged so that the different photons emitted from the wavelength tunable microcavity laser system (102) are arranged so that photons having a relatively short wavelength are emitted before photons having a relatively long wavelength, and wherein the dispersive medium (114) exhibits anomalous dispersion.

In another embodiment, there is provided an optical pulse system (100) for generating a compressed optical pulse (112), wherein the dispersive medium (114) is chosen from the group comprising:
a fiber, such as a dispersion compensating fiber, and
a grating pair.
a prism pair
a chirped distributed fiber bragg grating.

In an alternative embodiment of the invention, there is provided an optical pulse system (100) for generating a compressed optical pulse (112), the system comprising:
A wavelength tunable microcavity laser system (102), comprising
an optical cavity (104) with an adjustable cavity length (L), so as to enable the wavelength tunable microcavity laser system to emit photons of different wavelengths with respect to each other,
a photon emitter (106), such as a gain medium, for emitting photons into the optical cavity,
a cavity controller (108a), such as a waveform generator, arranged for controlling the length of the optical cavity,
where the wavelength tunable microcavity laser system is being arranged for emitting a primary optical pulse having a primary temporal width, where the cavity controller is arranged for adjusting the optical cavity length so that said primary optical pulse comprises temporally separated photons of different wavelengths, such as corresponding to the optical cavity length,
A dispersive medium arranged for receiving the primary optical pulse, and for re-emitting the primary optical pulse as a compressed optical pulse with a secondary temporal width,
wherein the secondary temporal width is smaller than the primary temporal width.

It may be understood that according to this embodiment, the optical cavity may have, e.g., an mechanically and/or electrooptically adjustable length.

According to a third aspect of the invention, there is provided use of a method for generating a compressed optical pulse according to the first aspect and/or an optical pulse system according to the second aspect, for any one of:
multiphoton spectroscopy,
material processing, such as using the optical pulse system according to the second aspect and further comprising a semiconductor optical amplifier (SOA),
Femtochemistry,
Sampling systems (depending on the jitter properties)
THz generation.

By 'femtochemistry' may be understood use of the system for examining chemical bond breaking or bond formation on the femtosecond ($10^{-15}$ second) time scale, such as recording snapshots of chemical reactions, such as strobing of the transition-state region between reagents and products.

By 'sampling systems' may be understood use of the system for probing an object under examination. This could be a repetitive electrical or optical signal which can be mapped at a high temporal resolution overlapping the signal in an optical gate by scanning the pulses across the signal. Pump probe spectroscopy also falls in this category.

By 'THz generation' may be understood use of the system for generating electromagnetic radiation with frequencies between the high-frequency edge of the millimeter wave band, 300 gigahertz ($3 \times 10^{11}$ Hz), and the low frequency edge of the far-infrared light band, 3000 GHz ($3 \times 10^{12}$ Hz).

In an embodiment, the wavelength tunable microcavity laser system may comprise a wavelength tunable photon source comprising
a first element comprising a first mirror,
a second element comprising a second mirror,
a third element comprising the photon emitter,
where the first element and the second element and the third element are placed in relation to each other, so that
i. the first mirror and the second mirror define at least a part of the optical cavity, and so that
ii. the photon emitter is placed inside the optical cavity, wherein
the first mirror may move, such as move with respect to the second mirror, and wherein the wavelength tunable photon source further comprises the cavity controller (108a) arranged for controlling the length of the optical cavity by moving the first mirror, such as the cavity controller comprising means for electrically accessing the first element, such as means for electrostatically moving the first mirror, such as moving the first mirror so as to enable changing a cavity length of the optical cavity.

By 'wavelength tunable photon source' is understood a source of photons wherein the wavelength of the photons may be controllably adjusted. It may be understood that in the context of the present application, the 'wavelength tunable photon source' may be used interchangeably with a 'wavelength tunable microcavity laser system'.

By 'first element' may be understood a structural element comprising a first mirror.

By 'first mirror' may be understood a mirror capable of defining a mirror surface in an optical cavity. It is understood that the first mirror may move, such as move with respect to the second mirror, such as move so as to change an optical path length of the optical cavity.

It may be understood, that the first element and the first mirror may be rigidly coupled so that moving the first element necessarily entails moving the first mirror and vice versa.

It may be understood, that the first element and/or the first mirror may form at least part of the MEMS component.

In a particular embodiment, the first element may be formed by a high-index-contrast subwavelength grating (HCG) pre-patterned silicon-on-insulator (SOI) substrate, which may comprise a buried HCG, such as the HCG disposed between spacing layers as a lower mirror reflector, as described in WO2012/0149497A2 which is hereby incorporated by reference in entirety.

By 'second element' may be understood a structural element comprising a second mirror.

By 'second mirror' may be understood a mirror capable of defining a mirror surface in an optical cavity. In some embodiments, the second element may substantially be embodied, such consist of, the second mirror, such as the second element being the second, such as the second element being the second mirror deposited onto another element, such as deposited onto the third element.

Any one of the first mirror and/or the second mirror may in exemplary embodiments comprise a distributed Bragg reflector or an HCG. In other embodiments the mirror and/or the second mirror may comprise any one of metal mirrors and/or highly reflective and highly polarization selective diffraction gratings (GIRO-gratings) as described in *"First demonstration of highly reflective and highly polarization selective diffraction gratings (GIRO-gratings) for long-wavelength VCSELs"*, Goeman S., et al., Photonics Technology Letters, IEEE (Volume: 10, Issue: 9), September 1998, Page(s): 1205-1207, which reference is hereby included by reference in its entirety. Combinations of different types of mirrors may be encompassed by the present invention.

In a particular embodiment, the second element may be integrated with the third element in a half-VCSEL laser heterostructure having an upper mirror reflector (i.e., the second mirror), and an active region (i.e., the photon emitter) beneath said upper mirror reflector, such as described in WO2012/0149497A2 which is hereby incorporated by reference in entirety.

By 'third element' may be understood a structural element comprising a photon emitter. The 'third element' may be bought from commercial suppliers, such as III-V semiconductor epitaxial wafers which may be purchased from epitaxial wafer foundries.

By 'the photon emitter is placed inside the optical cavity' (such as the method comprises placing the photon emitter inside the optical cavity) is understood that the photon emitter is placed so as to enable emission of a photon directly into the cavity, such as directly into a cavity mode. By placing the photon emitter inside the cavity, the potential loss of photons entering into the cavity is eliminated. Furthermore, if the photon emitter is an active laser medium, a LASER may be provided.

By 'means for electrically accessing the first element' may be understood electrical connections to electrodes arranged for electrostatic actuation, electrical connections to piezo-electrical elements (where the piezo-electrical elements may be arranged for mechanically actuating the first element) or electrical connections enabling thermal actuation, such as electrical connections to a resistive bimorph element enabling heating at least a part of the first element via resistive heating.

In another embodiment, there is provided a method wherein the method comprises placing an anti-reflection (AR) coating on at least a portion of a surface of the third element which delimits the inner volume. In analogy hereto, in an embodiment, there is placed an anti-reflection (AR) coating on at least a portion of a surface of the third element which delimits the inner volume. Anti-reflection coatings are known in the art, and may for example comprise any one of $TiO_2/SiO_2$, $Al_2O_3$, SiON, BCB. In an embodiment the AR coating is a dielectric coating, such as siliconoxynitride. In an embodiment, the AR coating has a refractive index substantially equal to the square root of the refractive index of the element upon which it is placed.

In an embodiment, the anti-reflection coating (AR coating) reflectivity is less than 10%, such as less than 5%, such as less than 2%, such as less than 1% at the reference wavelength.

In an embodiment there is no anti-reflection coating on at least a portion of a surface, such as on the surface, of the third element which delimits the inner volume, such as the optical cavity defined by the first mirror and the second mirror comprises an additional mirror within said optical cavity.

In an embodiment, there is provided a wavelength tunable photon source which is electrically pumped, such as comprising means for electrical pumping, such as electrodes. An advantage of electrical pumping may be that once the structures for electrical pumping are provided, such as the electrodes connected to a pn-junction, the pumping may be carried out merely by supplying electrical current, which may be seen as relatively simple, e.g., compared to supplying photons in the case of optical pumping.

In an embodiment, there is provided a wavelength tunable photon source which is optically pumped, such as comprising means for optical pumping, such as comprising a pump light source, such as a pump laser. The pump light source may emit light having a wavelength being smaller than the reference wavelength. An advantage of optical pumping may be that the structure of the wavelength tunable photon source may be kept relatively simple since the need for, e.g., electrodes in the case of electrical pumping may be dispensed with.

In another embodiment, there is provided a wavelength tunable photon source wherein the means for enabling moving the first element comprises an electrode, such as a set of electrodes, for supporting an electrical field between the first element and the electrode so as to move the first element, such as moving the first element in a direction towards or away from the second mirror. The electrode may be electrically accessible from the outside of the wavelength tunable photon source, and may be arranged so that the electrical field enables moving the first element via electrostatic actuation. An advantage of this embodiment may be that it enables moving the first element in a simple yet efficient way. In an embodiment, the electrode is arranged for moving, such as dynamically or statically moving, the first element away from the second mirror.

In another embodiment, there is provided a wavelength tunable photon source wherein the electrical field is arranged for moving the first element in a direction away from the second mirror. An advantage thereof may be that the effects of the so-called pull-in may be mitigated.

In another embodiment, there is provided a wavelength tunable photon source wherein the photon emitter is a laser gain medium and wherein the wavelength tunable photon source is arranged for enabling emitting laser light. In an embodiment, the wavelength tunable photon source is a wavelength tunable LASER. LASERs are known in the art.

In another embodiment, there is provided a wavelength tunable photon source wherein the first mirror comprises a High-Contrast Grating (HCG). In another embodiment, there is provided a wavelength tunable photon source wherein the optical cavity comprises at least one anti-reflection coating.

By a 'reference wavelength' (lambda ($\lambda_0$)) may be understood the central operating wavelength of a photon source, such as for a plot of laser power against wavelength it would be given as the wavelength of highest intensity, such as the wavelength of highest intensity during normal use, such as when the first mirror is in a non-actuated position. Thus, the central operating wavelength may be understood as the wavelength of highest intensity when the first mirror is in a non-actuated position. The reference wavelength may in general and/or in exemplary embodiments be on the order of 1 micrometer, such as within 100 nm-10 micrometer, such as within 350 nm-5.5 micrometer, such as within 800 nm-3 micrometer, such as 350 nm, such as 800 nm, such as 1 micrometer, such as 1.3 micrometer, such as 1.5 micrometer, such as 2 micrometer, such as 3 micrometer, such as 5.5 micrometer, such as 10 micrometer.

In another embodiment, there is provided a wavelength tunable photon source, wherein a tuning range in relation to a reference wavelength, is larger than 1%, such as larger than 2%, such as larger than 3%, such as larger than 4%, such as larger than 5%, such as larger than 7.5%, such as larger than 10%, such as larger than 12.5%, such as larger than 15%. A possible of such relatively large tuning range, may be that the photon source may be applicable for a wider range of wavelengths. In an embodiment there is provided an optically pumped photon source wherein the tuning range is larger than 10%, such as larger than 12.5%, such as larger than 15%. In an embodiment there is provided an electrically pumped photon source wherein the tuning range is larger than 5%, such as larger than 6.5%, such as larger than 7.5%, such as larger than 10%.

In an embodiment, there is also provided a current source for electrical pumping of the photon emitter and/or a light source for optical pumping of the photon emitter. In an embodiment, the wavelength tunable photon source according to the first aspect and/or the second aspect comprises a current source for electrical pumping and/or a light source for optical pumping.

The first, second and third aspect of the present invention may each be combined with any of the other aspects. These and other aspects of the invention will be apparent from and elucidated with reference to the embodiments described hereinafter.

BRIEF DESCRIPTION OF THE FIGURES

The wavelength tunable photon source according to the invention will now be described in more detail with regard to the accompanying figures. The figures show one way of implementing the present invention and is not to be construed as being limiting to other possible embodiments falling within the scope of the attached claim set.

DETAILED DESCRIPTION OF AN EMBODIMENT

Figure 1:
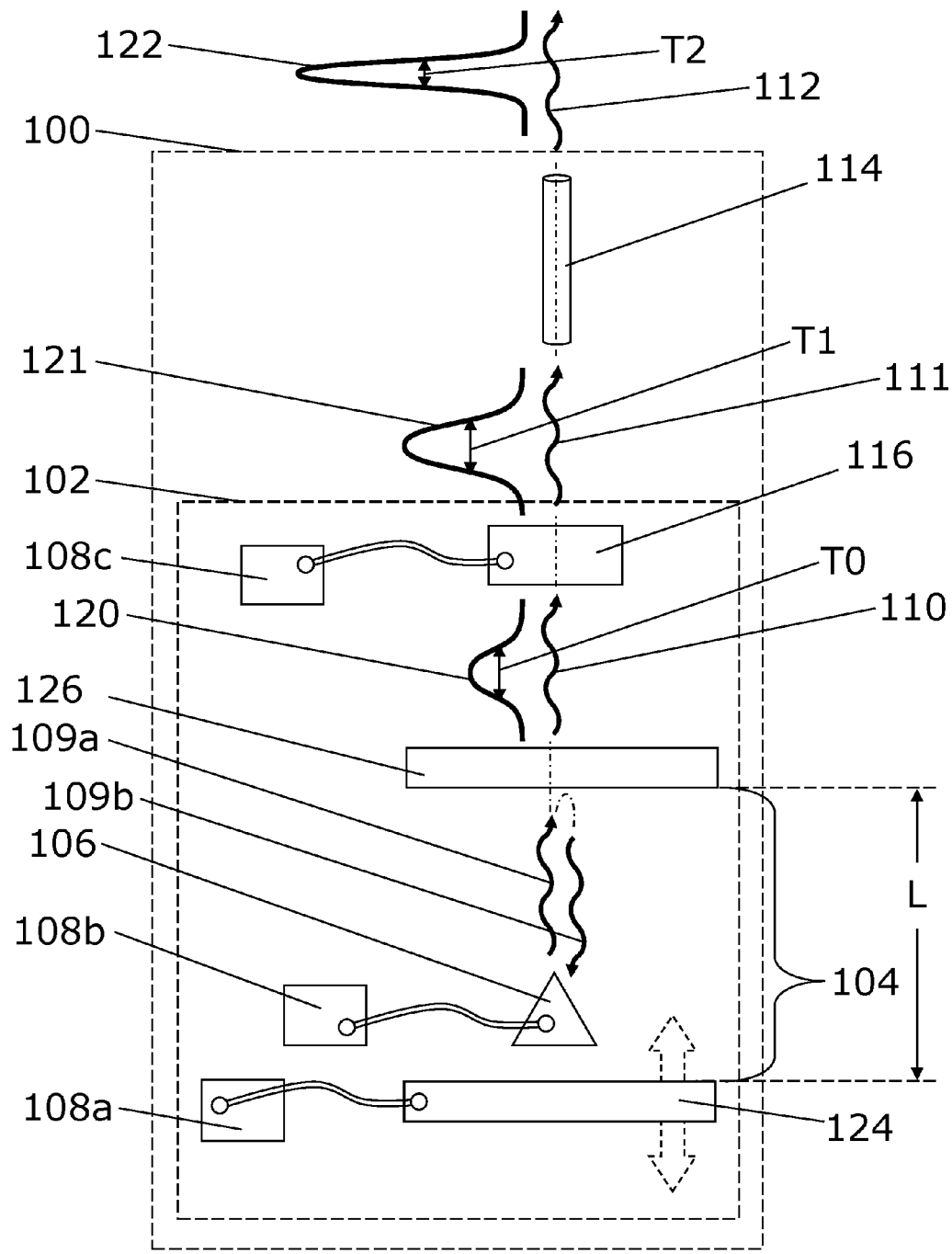
FIGS. 1-2 show optical pulse systems for generating a compressed optical pulse.

FIG. 1 shows an optical pulse system 100 for generating a compressed optical pulse 112 comprising:
A wavelength tunable microcavity laser system 102, comprising
an optical cavity 104 with a mechanically adjustable cavity length (L), so as to enable the wavelength tunable microcavity laser system to emit photons of different wavelengths with respect to each other,
a photon emitter 106 for emitting photons into the optical cavity,
a cavity controller 108a arranged for controlling the length (L) of the optical cavity 104,
where the wavelength tunable microcavity laser system 102 is being arranged for emitting a primary optical pulse 111 having a primary temporal width (T1), where the cavity controller 108a is arranged for adjusting the optical cavity length (L) so that said primary optical pulse 111 comprises temporally separated photons of different wavelengths,
A dispersive medium 114 arranged for receiving the primary optical pulse 111, and for re-emitting the primary optical pulse as a compressed optical pulse 112 with a secondary temporal width (T2),
wherein the secondary temporal width (T2) is smaller than the primary temporal width (T1).

The figure furthermore shows a first element 124, a second element 126, an optical pulse 109a emitted from the photon emitter within the optical cavity, an optical pulse 109b reflected within the optical cavity from the second mirror on the second element 126. It may be seen that a pulse 110 (from which the primary optical pulse 111 originates) emitted from the optical cavity (but before the optical amplifier 116) has a shape 120 and a temporal width (T0). The figure furthermore shows the primary shape 121 of the primary optical pulse, and the shape 122 of the compressed optical pulse. The photon emitter 106 is operably connected to a current source 108b. The optical amplifier 116 is operably connected to a controlling unit 108c.

Figure 2:
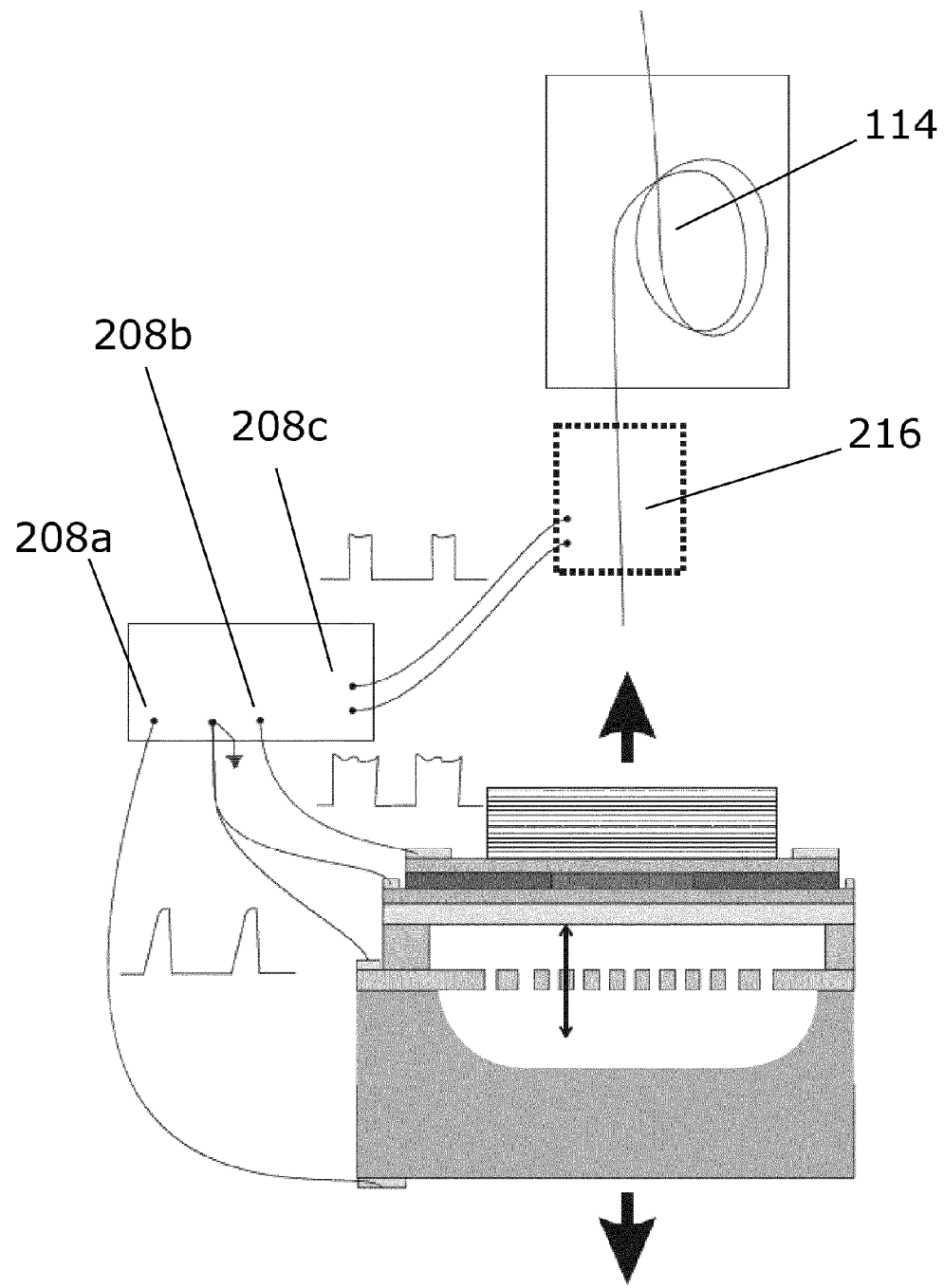

FIG. 2 shows another optical pulse system with optical pulse system for generating a compressed optical pulse comprising a cavity controller 208a arranged for controlling the length of the optical cavity. It may be noted that the signal from the cavity controller may be sinusoidal, but it need not necessarily be sinusoidal, it could have an arbitrary waveform. The photon emitter is operably connected to a current source 208b. The optical amplifier 216 is operably connected to a controlling unit 208c. It may be noted that the signal from the optical amplifier may be suited for increasing the intensity of the optical pulse, but it may also decrease the intensity, or it may, e.g., increase the intensity in a temporally central part of the pulse and/or decrease temporally decentral portions of the pulse, such as substantially "cut off" edges of the pulse. The cavity controller 208a, the current source 208b and the controlling unit 208c are all integrated into the same waveform generator. The figure furthermore shows a dispersive element 214, which is a dispersion compensating fiber.

FIG. 3 illustrates an exemplary embodiment of the invention.

Figure 3A:
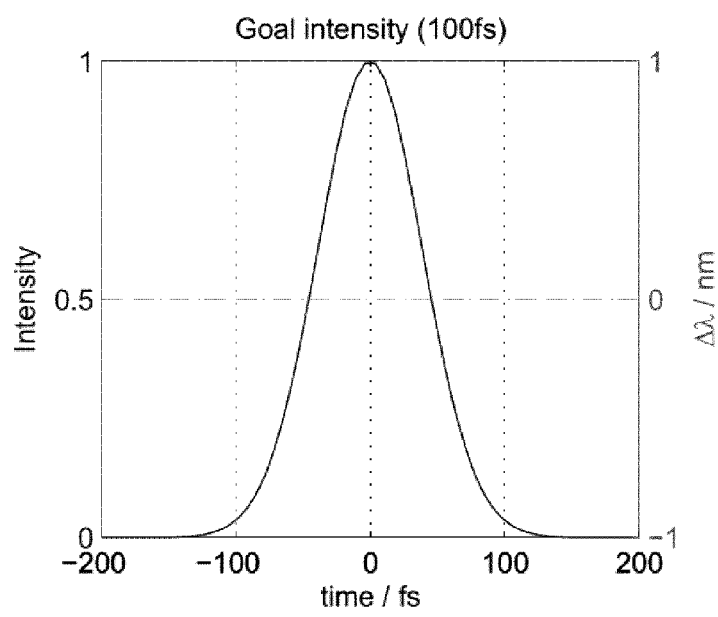
FIG. 3 illustrates an exemplary embodiment of the invention.

FIG. 3A shows a goal intensity with respect to time (the full drawn line referring to the left side axis), i.e., a desired pulse. The goal intensity corresponds to a pulse with a shape which is substantially Gaussian, a normalized, maximum intensity '1' and a temporal width (FWHM) of 100 fs. The wavelength through the pulse is constant at 1550 nm, the wavelength variation is shown in the dashed line.

Figure 3B:
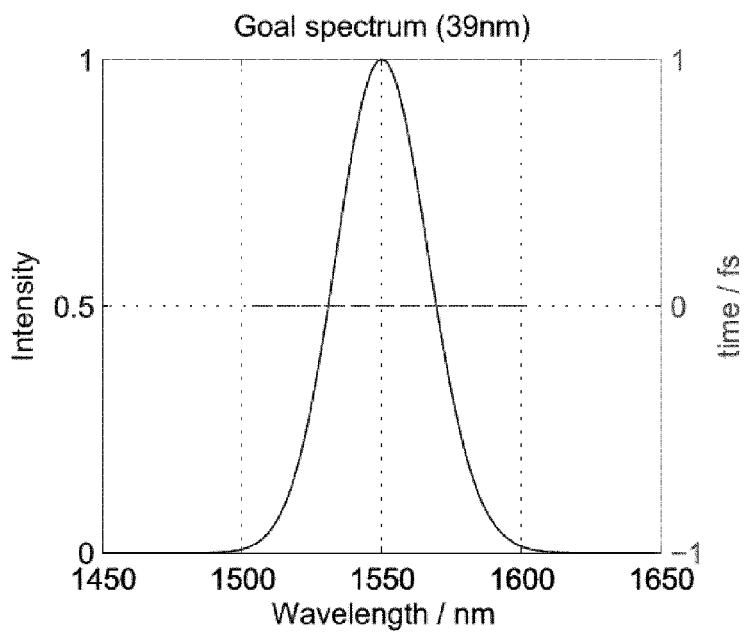

FIG. 3B shows the corresponding goal spectrum (the full drawn line referring to the left side axis), i.e., intensity with respect to wavelength and temporal shift (the dashed line referring to the right side axis) through the pulse which is zero for the unchirped pulse in FIG. 3A.

Thus, FIGS. 3A-B shows the intensity and spectrum of how the compressed optical pulse should ideally look like. Thus, getting a compressed optical pulse as close to this spectrum and/or intensity may be seen as the predetermined criteria.

Figure 3C:
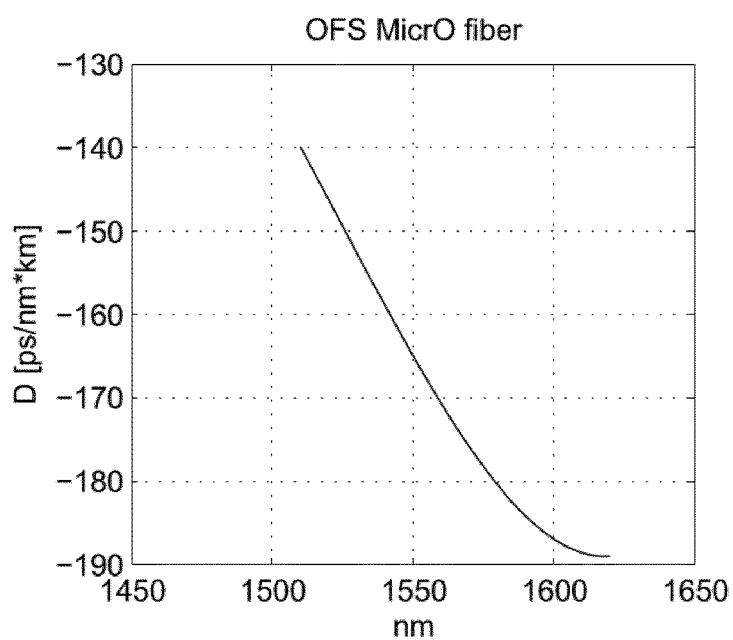

FIG. 3C shows the dispersion characteristics 'D' (where length has not been taken into account, such as the dispersion characteristics per length unit) of a fiber from the company OFS (a Furukawa company)

$$D=(3.62801e-11*(\lambda/nm)^4+2.43016e-5*(\lambda/nm)^3-1.116476e-1*(\lambda/nm)^2+1.69820e2*(\lambda/nm)-8.58582e4)*ps/(nm*km)$$

Figure 3D:
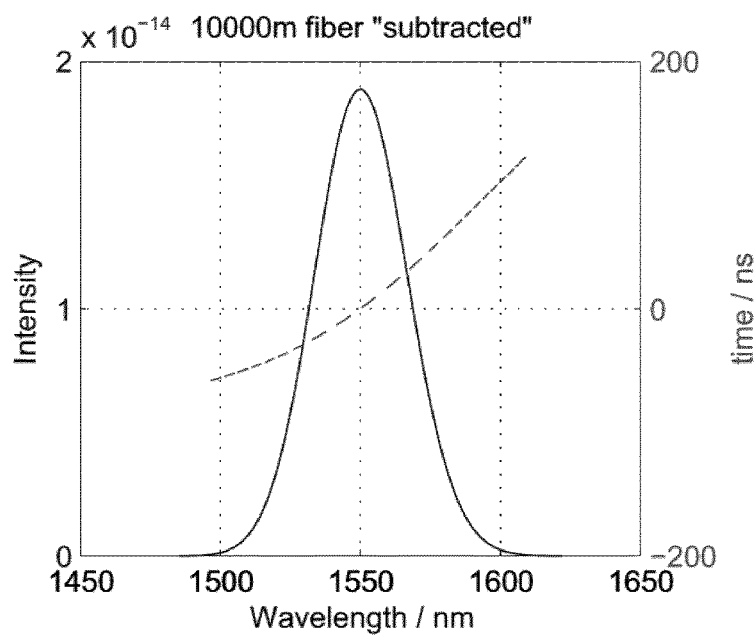
Figure 3E:
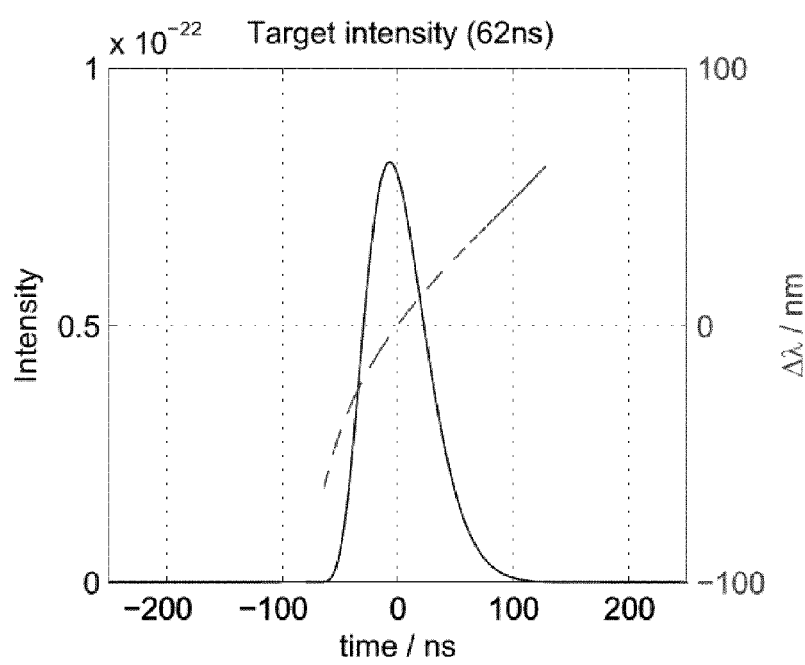

FIG. 3D-E show illustrations of the result of a calculation of what properties a pulse with the properties depicted in FIGS. 3A-B should have before passing through 10000 m of an optical fiber with properties as depicted in FIG. 3C.

FIG. 3D shows intensity (the full drawn line referring to the left side axis) with respect to wavelength and temporal shift (the dashed line referring to the right side axis) through the pulse. It is noted that the depicted optical pulse has a spectral distribution (cf., the full drawn line showing intensity with respect to wavelength) which may be described by a continuous function. It is noted that the spectral distribution of the depicted optical pulse may be described by a function which does not have wavelength regions with non-zero intensity which are separated by one or more wavelength regions which have substantially zero, such as zero, intensity. It is noted that the depicted optical pulse has a temporally resolved spectral distribution (cf., the dashed line showing temporal shift through the pulse, i.e., wavelength as a function of time) which may be described by a continuous function.

FIG. 3E shows intensity (the full drawn line referring to the left side axis) with respect to time and the wavelength (the dashed line referring to the right side axis) through the pulse.

In other words, the properties shown in FIGS. 3D-E match the properties the primary optical pulse should have (the 'target properties') so as to end up with the properties depicted in FIGS. 3A-B after after having passed through 10000 m of an optical fiber with properties as depicted in FIG. 3C. The 'target properties' depicted in FIGS. 3D-E can be fitted to the expressions (for wavelength λ and intensity (I)) given by:

$$\lambda(t)/nm=0.0145*(t/ns)^9-0.0735*(t/ns)^8+0.177*(t/ns)^7-0.458*(t/ns)^6+1.59*(t/ns)^5-5.25*(t/ns)^4+19.6*(t/ns)^3-67.2*(t/ns)^2+605*(t/ns)+1545.27$$

$$I(t)=\exp(-0.0268*(t/ns)^4-0.01*(t/ns)^3-0.000621*(t/ns)^2+7.66e-06*(t/ns)-6.13e-08),$$ where the fit has been made for the data within the temporal range −100 ns<t<100 ns.

An advantage of having a fit may be that it enables providing a mathematical function, such as a smooth mathematical function which describes the 'target properties', i.e., properties which the 'primary optical pulse' should have. The mathematical function may be used for generating and/or simulating the primary optical pulse, since the mathematical function may be supplied to, e.g., the cavity controller and/or other components capable of influencing the properties of the primary optical pulse, which may then entail that the primary optical pulse gets the properties described by the fit. Alternatively, the data of the 'target pulse', i.e., the data underlying the pulse as depicted in FIGS. 3D-E may be supplied directly, such as without fitting, to, e.g., the cavity controller and/or other components capable of influencing the properties of the primary optical pulse, which may then entail that the primary optical pulse gets the properties described by the 'target pulse'.

Figure 3F:
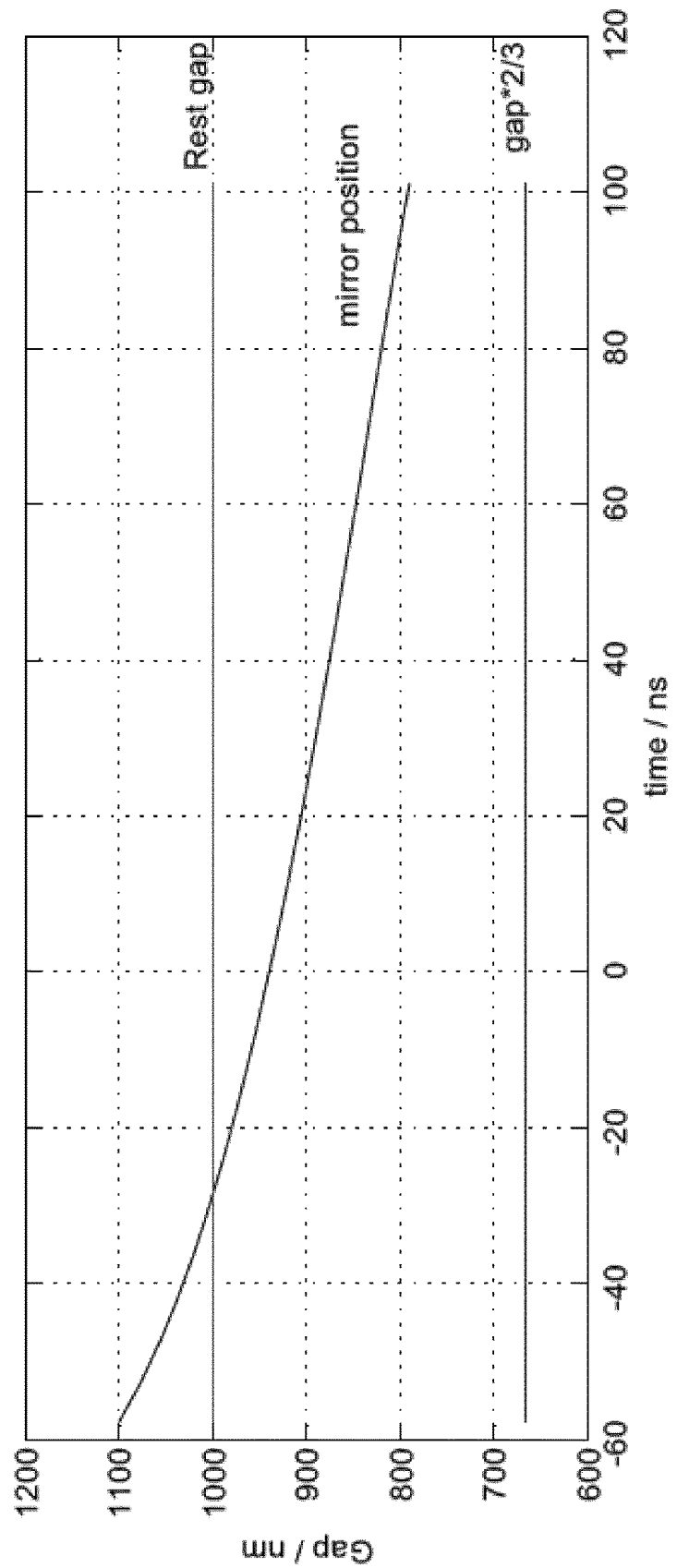

FIG. 3F shows how the mirror could be moved to get the wavelength variation in FIG. 3E. A tuning efficiency (wavelength change/cavity length change) of ⅓ and gap size (moving the MEMS mirror away from the other mirror) of 1000 nm has been assumed. The wavelength in rest position (indicated by the horizontal line 'Rest gap') for the MEMS is 1530 nm.

Figure 3G:
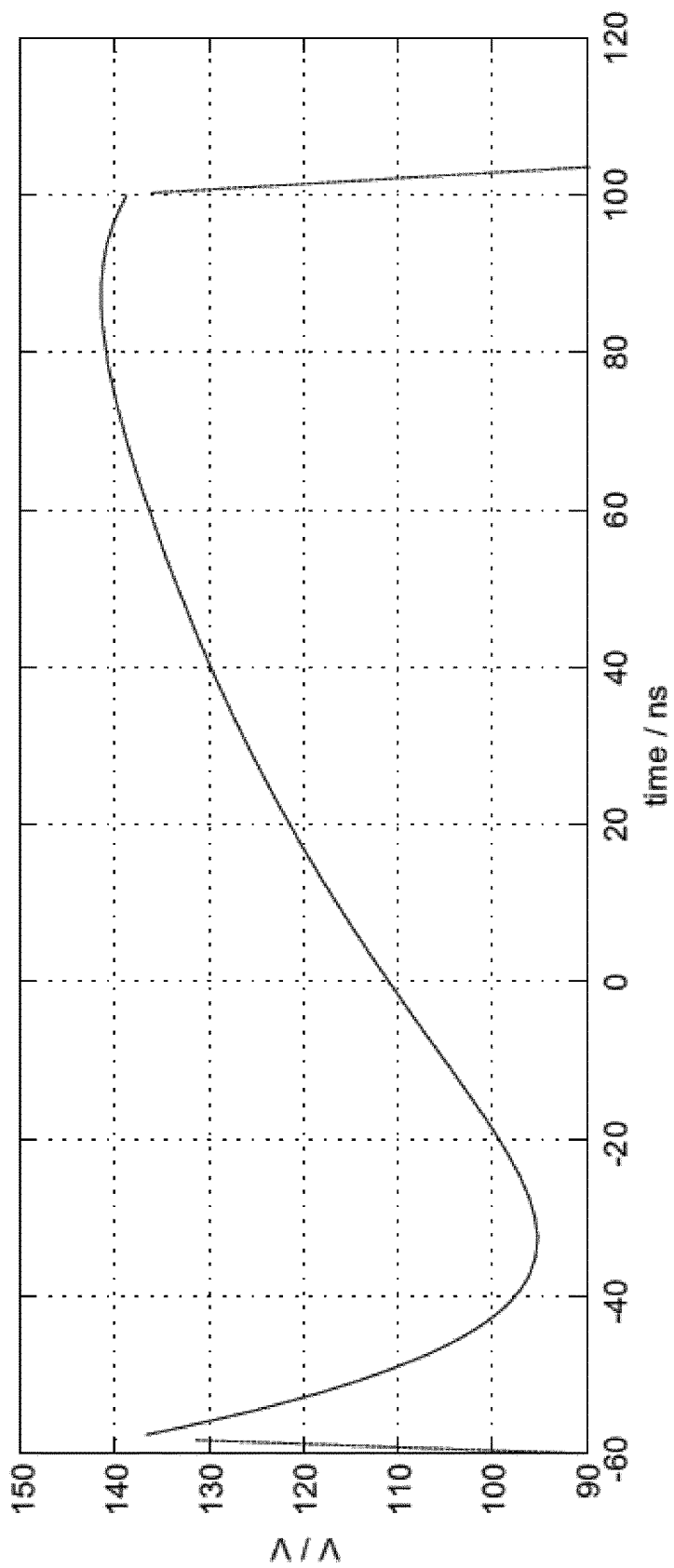

FIG. 3G shows a calculation of the repetitive voltage waveform which should be applied to an electrostatic actuated MEMS with the parameters from above and MEMS quality factor Q=4, MEMS resonance frequency 5 MHz, mirror area 100 um², mirror mass 69.9 pg, electrical resistance 50 Ohm, to get the gap change in FIG. 3F. A fit to the voltage (in units of volt) in this range is:

$$V/V=-0.19731*z^8-0.33818*z^7+2.1737*z^6-1.9488*z^5-1.3157*z^4+2.0745*z^3-4.9645*z^2+20.775*z+121.99$$

where z=(t/ns−21.186)/45.546

Figure 3H:
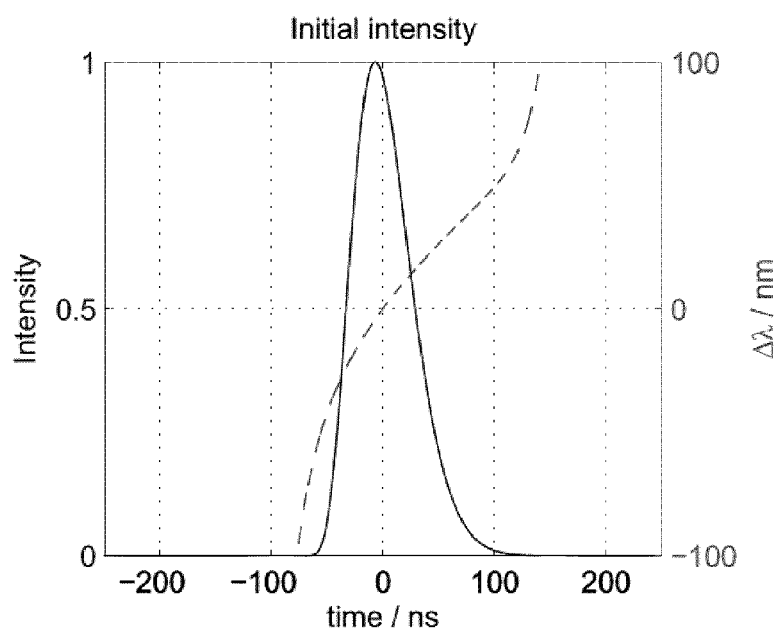

FIG. 3H corresponds to FIG. 3E, but is using the fits, and shows a 'primary optical pulse' having a temporal width (FWHM) of approximately 63 ns, and a maximum intensity of 1.

Figure 3I:
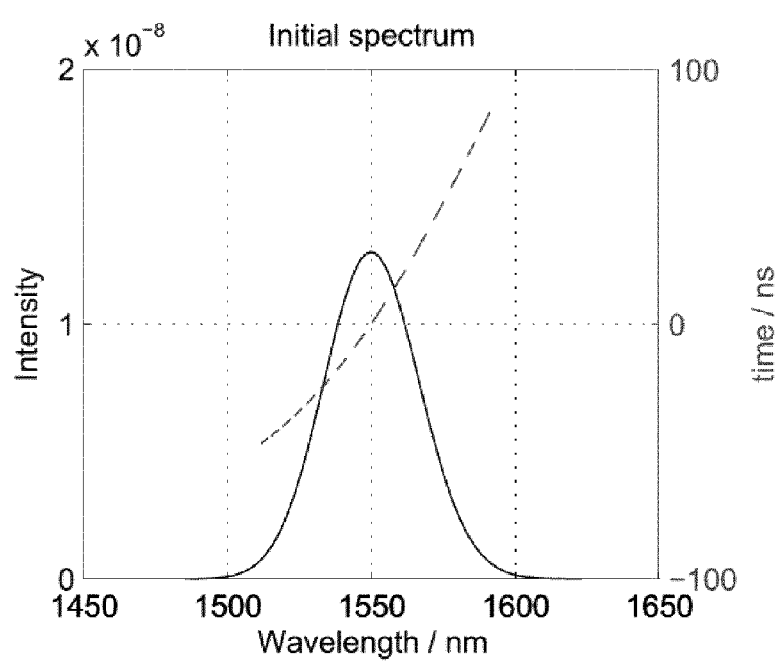

FIG. 3I is the spectral intensity corresponding to FIG. 3H.

Figure 3J:
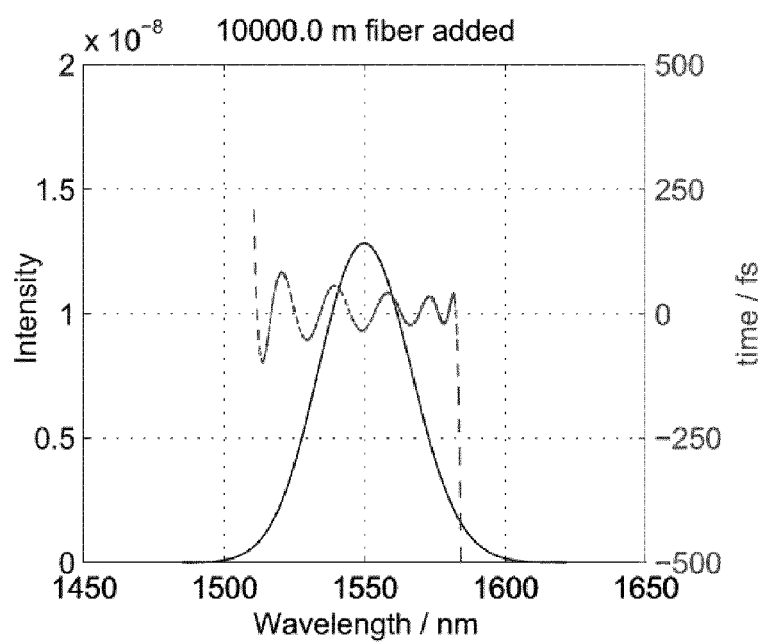

FIG. 3J shows the spectrum after passing the pulse from FIG. 3H/FIG. 3I through 10000 m of the fiber with dispersion from FIG. 3C.

Figure 3K:
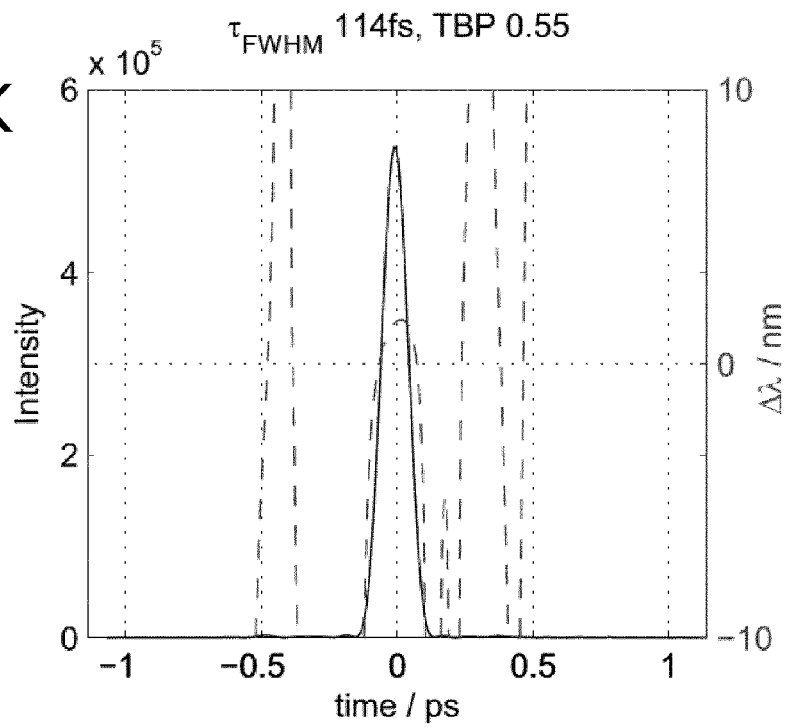

FIG. 3K is the pulse corresponding to the spectrum in FIG. 3J and demonstrates the possibility of providing the compressed optical pulse, as a substantially Gaussian pulse, said pulse being a 'compressed optical pulse' having a temporal width (FWHM) of approximately 0.114 ps, and a maximum intensity of approximately 5e5 times the maximum intensity in FIG. 3H, not including the transmission losses of the fiber (where the transmission losses might be approximately 5 dB for the present example, so that even after taking transmission losses of the fiber into account, a maximum intensity of approximately 1e5 times the maximum intensity in FIG. 3H is obtained).

FIG. 3 thus illustrates an example of an optical pulse system for generating a compressed optical pulse, wherein
a first ratio is given by peak power of the compressed optical pulse divided by the average power of the compressed optical pulse, and
a second ratio is given by peak power of the primary optical pulse divided by the average power of the primary optical pulse,
and wherein the first ratio is thus a factor 5.7e5 larger than the second ratio.

It may be noted, that the skilled person will readily be aware that similar examples may be realized based on other parameters, such as other dispersive media and/or other wavelengths, such as using lasers emitting at other wavelengths than 1530 nm, such as for example 1060 nm.

Example of a specific example of an optical pulse system for generating a compressed optical pulse could be composed of a MEMS VCSEL like that in the reference Ansbk et al IEEE J. Selected Topics in Quantum Electronics, 19(4), [1702306] (2013) doi: 10.1109/JSTQE.2013.2257164, which reference is hereby incorporated by reference in entirety, or the reference: Jayaraman et al Electronics Letters, 48 (14) p. 867-869 (2012), DOI: 10.1049/e1.2012.1552 which reference is hereby incorporated by reference in entirety, where the movable mirror is electrostatically pulled towards the other mirror or as shown in FIG. 2, where it is possible to apply electrostatic forces both away and towards the other mirror using either of the electrodes on the two sides of the MEMS mirror. Using the latter and using demonstrated parameters of MEMS quality factor Q=4, MEMS resonance frequency 5 MHz (cf., the reference Connie J. Chang-Hasnain et al, IEEE J. Selected Topics in Quantum Electronics, 15(3):869 (2009) doi: 10.1109/JSTQE.2009.2015195, which reference is hereby incorporated by reference in entirety,), mirror area 100 um$^2$, mirror mass 69.9 pg, gap size away from other mirror: 1000 nm, Resistance 50 Ohm, tuning efficiency (wavelength change/cavity length change) ⅓. The voltage can be applied used a fast digital-to-analog-converter (DAC) or arbitrary waverform generator (AWG) (e.g. Agilent 81180B) combined with an amplifier (e.g. Cernex CBPH1015249R). If the voltage to the MEMS contact is varied as shown in FIG. 3G and the wavelength in the rest position of the MEMS is 1530 nm the wavelength variation will be as shown in FIG. 3H. By also varying the current to the laser contact synchronized with the MEMS sweep, the amplitude can also be simply controlled e.g. as shown in FIG. 3H. This signal can be amplified and possibly further shaped by a semiconductor optical amplifier (e.g. Thorlabs® BOA1004PXS), but this can be omitted. The output is now as shown in FIG. 3H and 3I and can be sent through 10 km of OFS/Furukawa micro fiber with dispersion as shown in FIG. 3C. The output of this fiber will be an extremely short pulse which can be used for the intended application. Part of the pulse at the output can be split off and some of this signal can be sent to a silicon photodiode which will function as a two-photon detector. Another part of the splitted off output may be sent to a linear photodetector like an InGaAs photodiode to measure the average power. These two signals are now sent to a controller which can be used to adjust the sweep-signal for the MEMS to maximize the two-photon signal or the ratio of the two-foton signal to the single photon signal.

Figure 4:
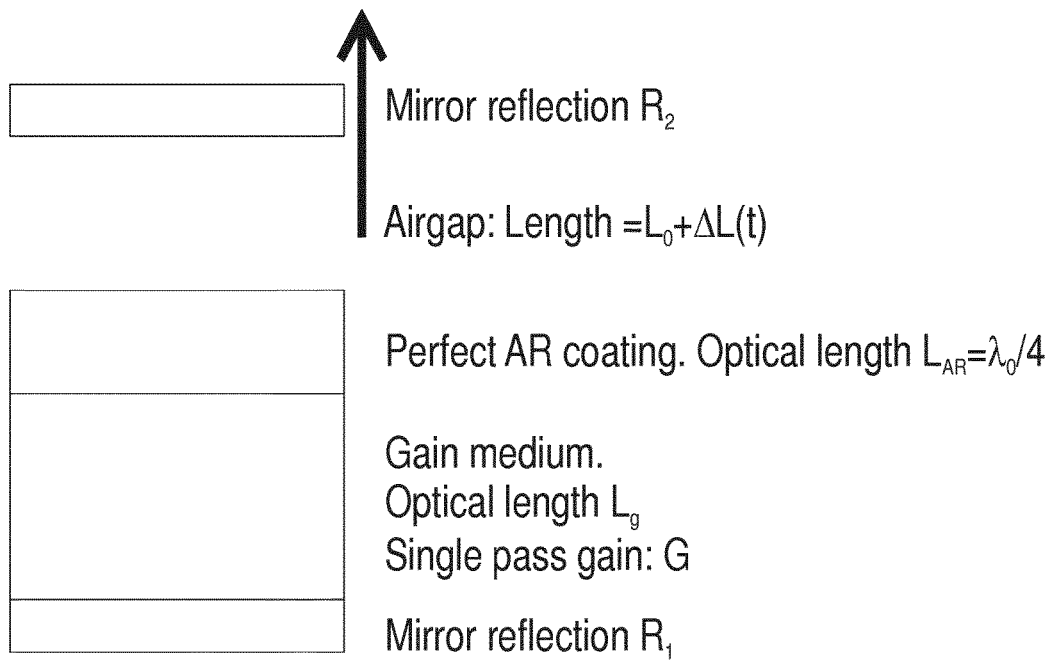
FIG. 4 shows shows an exemplary optical cavity.

FIG. 4 shows an exemplary optical cavity with a first (lower) mirror and a second (upper) mirror with, respectively, reflection of the mirrors $R_1$ and $R_2$. In the present example, the second, upper mirror may be controllably moved mechanically along an optical path between the first and second mirror, so that the cavity length is mechanically adjustable. The optical cavity comprises a photon emitter being a gain medium with optical length $L_g$. The optical cavity comprises an anti-reflection (AR) with optical length $L_{AR}=\lambda_0/4$ (lambda_0/4). The optical cavity comprises an air gap (between the AR coating and the second mirror) with optical length $L_0=L_0+\Delta L(t)$, where $\Delta L(t)$ indicates the change in length of the optical cavity with respect to time due to movement of the second, upper mirror. The penetration depths of the first and second mirror ($R_1$, $R_2$) are included in the static lengths $L_0$ and $L_g$. The total length of the optical cavity is thus given by:

$$L_{tot}=L_g+L_{AR}+L_0+\Delta L(t)$$

The reference wavelength is given for the case where $\Delta L(t)=0$ nm, i.e.:

$$\lambda_0=2*L_{tot}/N, \text{ where } N \text{ is an integer and } \Delta L(t)=0 \text{ nm.}$$

The instantaneous lasing wavelength is given by:

$$\lambda_n=2*L_{tot}/N, \text{ where } N \text{ is an integer.}$$

If the second mirror is moved, so that the length of the cavity changes with a speed of v, then $$\Delta L(t)=v*t$$

The roundtrip time $t_r$ in the cavity is given by:

$$t_r=2*L_{tot}/c$$

The wavelength change in one roundtrip is given by:

$$\Delta\lambda=2*(v*t_r)/N=4L_{tot}v/(cN), \text{ i.e., } \Delta\lambda/\lambda_0=2v/c$$

The Doppler shift $\Delta f$ of the light frequency $f_0$ from the moving mirror in the non-relativistic regime is known to be:

$$\Delta f/f_0=-2v/c$$

For small changes:

$$\Delta\lambda/\lambda_0=-\Delta f/f_0$$

So, for a cavity, such as the present exemplary cavity with a perfect AR coating, the Doppler shift is exactly equal to the wavelength change pr. roundtrip. The Doppler shift thus enables that the entire spectrum may be coherent. This may be seen as different with respect to other types of tunable lasers, where the emission builds up from spontaneous emission.

To sum up, there is presented a method of generating a compressed optical pulse (112) comprising emitting from a wavelength tunable microcavity laser system (102), comprising an optical cavity (104) with a mechanically adjustable cavity length (L), a primary optical pulse (111) having a primary temporal width (T1) while adjusting the optical cavity length (L) so that said primary optical pulse comprises temporally separated photons of different wavelengths, and transmitting said pulse through a dispersive medium (114), so as to generate a compressed optical pulse (112) with a secondary temporal width (T2), wherein the secondary temporal width (T2) is smaller than the primary temporal width (T1).

In embodiments E1-E15 of the invention, there is presented:

E1. A method for generating a compressed optical pulse (112), the method comprising:
  providing a wavelength tunable microcavity laser system (102), comprising
    an optical cavity (104) with a mechanically adjustable cavity length (L), so as to enable the wavelength tunable microcavity laser system to emit photons of different wavelengths with respect to each other,
    a photon emitter (106) for emitting photons into the optical cavity,
    a cavity controller (108a) arranged for controlling the length of the optical cavity,
  providing a dispersive medium (114),
  emitting a primary optical pulse (111) having a primary temporal width (T1) from the wavelength tunable microcavity laser system (102), adjusting the optical cavity length (L) so that said primary optical pulse comprises temporally separated photons of different wavelengths, receiving the primary optical pulse (111) with the dispersive medium (114), and re-emitting the primary optical pulse from the dispersive medium as a compressed optical pulse (112) with a secondary temporal width (T2), wherein the secondary temporal width (T2) is smaller than the primary temporal width (T1).

E2. A method according to embodiment E1 for generating a compressed optical pulse (112), wherein the temporally separated photons of different wavelengths within the primary optical pulse are coherent with each other.

E3. A method according to any of the preceding embodiments for generating a compressed optical pulse (112), wherein the optical cavity comprises a microcavity wherein the photon emitter is placed inside the microcavity.

E4. A method according to any of the preceding embodiments for generating a compressed optical pulse (112), wherein the optical cavity comprises a microcavity wherein the length of the microcavity is at least ½ times the reference wavelength and less than 10 times the reference wavelength.

E5. A method according to any of the preceding embodiments for generating a compressed optical pulse (112), wherein the primary optical pulse is emitted so that the temporally resolved spectral distribution of the primary optical pulse may be described by a continuous function.

E6. A method according to any of the preceding embodiments for generating a compressed optical pulse (112), wherein the optical cavity (104) comprises a MEMS component and wherein a position of the MEMS component is adjustable and wherein the cavity length (L) of the optical cavity (104) depends on the position of the MEMS component so that the cavity controller (108a) may control the cavity length (L) of the optical cavity by controlling the position of the MEMS component, and wherein the step of adjusting the optical cavity length (L) so that said primary optical pulse comprises temporally separated photons of different wavelengths, further comprises adjusting the position of the MEMS component.

E7. A method according to any of the preceding embodiments for generating a compressed optical pulse (112), wherein the method further comprises providing feedback information indicative of one or more of properties of the compressed optical pulse (112), and subsequently emitting a second primary optical pulse, where properties of the second primary optical pulse is based on said feedback information.

E8. An optical pulse system (100) for generating a compressed optical pulse (112) comprising:

A wavelength tunable microcavity laser system (102), comprising an optical cavity (104) with a mechanically adjustable cavity length (L), so as to enable the wavelength tunable microcavity laser system to emit photons of different wavelengths with respect to each other, a photon emitter (106) for emitting photons into the optical cavity, a cavity controller (108a) arranged for controlling the length (L) of the optical cavity (104), where the wavelength tunable microcavity laser system (102) is being arranged for emitting a primary optical pulse (111) having a primary temporal width (T1), where the cavity controller (108a) is arranged for adjusting the optical cavity length (L) so that said primary optical pulse (111) comprises temporally separated photons of different wavelengths, A dispersive medium (114) arranged for receiving the primary optical pulse (111), and for re-emitting the primary optical pulse as a compressed optical pulse (112) with a secondary temporal width (T2), wherein the secondary temporal width (T2) is smaller than the primary temporal width (T1).

E9. An optical pulse system (100) for generating a compressed optical pulse (112) according to embodiment E8, wherein the wavelength tunable microcavity laser system (102) further comprises an optical amplifier (116).

E10. An optical pulse system (100) for generating a compressed optical pulse (112) according to any one of embodiments E8-E9, wherein a primary shape (121) of the primary optical pulse (111) may be shaped by temporally varying an amplification of the optical amplifier (116) and/or by temporally varying an emission of photons from the photon emitter (106).

E11. An optical pulse system (100) for generating a compressed optical pulse (112) according to any one of embodiments E8-E10, wherein the wavelength tunable microcavity laser system (102) is arranged for emitting the primary optical pulse (111) with a primary shape and/or primary spectral distribution with respect to time which is tailored to the dispersion characteristics of the dispersive medium (114).

E12. An optical pulse system (100) for generating a compressed optical pulse (112) according to any one of embodiments E8-E11, wherein the wavelength tunable microcavity laser system (102) is arranged for comprising and/or receiving information indicative of the dispersion characteristics of the dispersive medium (114).

E13. An optical pulse system (100) for generating a compressed optical pulse (112) according to any one of embodiments E8-E12, wherein the optical cavity (104) comprises a MEMS component and wherein a position of the MEMS component is adjustable and wherein the cavity length (L) of the optical cavity (104) depends on the position of the MEMS component so that the cavity controller (108a) may control the cavity length (L) of the optical cavity by controlling the position of the MEMS component, and wherein the Q-factor of the MEMS component is within the range from 10 to critically damped.

E14. An optical pulse system (100) for generating a compressed optical pulse (112) according to any one of embodiments E8-E13, wherein a first ratio is given by peak power of the compressed optical pulse divided by the average power of the compressed optical pulse, and a second ratio is given by peak power of the primary optical pulse divided by the average power of the primary optical pulse, and wherein the first ratio is at least a factor 1000 larger than the second ratio.

E15. Use of a method for generating a compressed optical pulse according to any one of embodiments E1-E7 and/or an optical pulse system (100) according to any of embodiments E8-E14, for any one of:

multiphoton spectroscopy, material processing,

Femtochemistry,
Sampling systems,
THz generation.

For the above embodiments E1-E15, it may be understood that reference to preceding 'embodiments' may refer to preceding embodiments within embodiments E1-E15.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method for generating a compressed optical pulse, the method comprising:
   providing a wavelength tunable microcavity laser system having a reference wavelength corresponding to a central operating wavelength, comprising:
      an optical cavity with a mechanically adjustable cavity length, so as to enable the wavelength tunable microcavity laser system to emit photons of different wavelengths with respect to each other, wherein the optical cavity comprises a microcavity, wherein the length of the microcavity is at least ½ times the reference wavelength and less than 10 times the reference wavelength, wherein the optical cavity comprises a MEMS component, wherein a position of the MEMS component is adjustable and, wherein the cavity length of the optical cavity depends on the position of the MEMS component so that a cavity controller may control the cavity length of the optical cavity by controlling the position of the MEMS component,
      a photon emitter for emitting photons into the optical cavity,
      a cavity controller arranged for controlling the length of the optical cavity,
   providing a dispersive medium,
   emitting a primary optical pulse having a primary temporal width from the wavelength tunable microcavity laser system,
   adjusting the optical cavity length so that said primary optical pulse comprises temporally separated photons of different wavelengths,
   receiving the primary optical pulse with the dispersive medium, and
   re-emitting the primary optical pulse from the dispersive medium as a compressed optical pulse with a secondary temporal width,
   wherein the secondary temporal width is smaller than the primary temporal width,
   and wherein the
   adjusting the optical cavity length so that said primary optical pulse comprises temporally separated photons of different wavelengths, further comprises adjusting the position of the MEMS component.

2. The method according to claim 1, wherein the adjusting the optical cavity length so that said primary optical pulse comprises temporally separated photons of different wavelengths comprises moving a mirror forming a boundary at one end of the optical cavity whereby a doppler shift from the moving mirror causes wavelengths of some part of the pulse to change.

3. The method according to claim 1, wherein the temporally separated photons of different wavelengths within the primary optical pulse are coherent with each other.

4. The method according to claim 1, wherein the optical cavity comprises a microcavity, wherein the photon emitter is placed inside the microcavity.

5. The method according to claim 1, wherein the primary optical pulse is emitted so that the temporally resolved spectral distribution of the primary optical pulse may be described by a continuous function.

6. The method according to claim 1, further comprising providing feedback information indicative of one or more of properties of the compressed optical pulse, and subsequently emitting a second primary optical pulse, wherein the properties of the second primary optical pulse are based on said feedback information.

7. The method according to claim 1, wherein a primary shape of the primary optical pulse is shaped by:
   temporally varying an amplification of an optical amplifier, wherein the wavelength tunable microcavity laser system further comprises the optical amplifier
   and/or by :
   temporally varying an emission of photons from the photon emitter.

8. The method according to claim 1, further comprising:
   receiving information regarding dispersion characteristics of the dispersive medium, and
   arranging the primary optical pulse with a primary shape and/or primary spectral distribution with respect to time which is tailored to the dispersion characteristics of the dispersive medium so that the primary optical pulse is arranged so that the compressed optical pulse is optimized relative to a predetermined criterium.

9. A method for generating a compressed optical pulse comprising:
   performing multiphoton spectroscopy, material processing, femtochemistry, system sampling or THz generation with the optical pulse system according to claim 1.

10. An optical pulse system for generating a compressed optical pulse comprising:
    a wavelength tunable microcavity laser system having a reference wavelength corresponding to a central operating wavelength, comprising:
       an optical cavity with a mechanically adjustable cavity length, so as to enable the wavelength tunable microcavity laser system to emit photons of different wavelengths with respect to each other, wherein the optical cavity comprises a microcavity, wherein the length of the microcavity is at least ½times the reference wavelength and less than 10 times the reference wavelength, wherein the optical cavity comprises a MEMS component, wherein a position of the MEMS component is adjustable, and wherein the cavity length of the optical cavity depends on the position of the MEMS component so that a cavity controller may control the cavity length of the optical cavity by controlling the position of the MEMS component,
       a photon emitter for emitting photons into the optical cavity, a cavity controller arranged for controlling the length of the optical cavity, wherein the wavelength tunable microcavity laser system is configured to emit a primary optical pulse having a primary temporal width, wherein the cavity controller is arranged for adjusting the optical cavity length by adjusting the position of the MEMS component so that said primary optical pulse comprises temporally separated photons of different wavelengths, a dispersive medium arranged for receiving the primary optical pulse, and for re-emitting the primary optical pulse as a compressed optical pulse with a secondary temporal width, wherein the secondary temporal width is smaller than the primary temporal width.

11. The optical pulse system according to claim 10, wherein the cavity controller is arranged for moving a mirror forming a boundary at one end of the optical cavity whereby a doppler shift from the moving mirror causes wavelengths of some part of the pulse to change, so as to be arranged for adjusting the optical cavity length by adjusting so that said primary optical pulse comprises temporally separated photons of different wavelengths.

12. The optical pulse system according to claim 10, wherein the wavelength tunable microcavity laser system further comprises an optical amplifier.

13. The optical pulse system according to claim 10, wherein the wavelength tunable microcavity laser system is arranged for emitting the primary optical pulse with a primary shape and/or primary spectral distribution with respect to time which is tailored to the dispersion characteristics of the dispersive medium so that the primary optical pulse is arranged so that the compressed optical pulse is optimized relative to a predetermined criterium.

14. The optical pulse system according to claim 10, wherein the wavelength tunable microcavity laser system is arranged for comprising and/or receiving information indicative of the dispersion characteristics of the dispersive medium.

15. The optical pulse system according to claim 10, wherein the optical pulse system comprises:

a computer-readable storage medium being arranged for comprising information indicative of the dispersion characteristics of the dispersive medium, and/or a data interface arranged for receiving information indicative of the dispersion characteristics of the dispersive medium.

16. The optical pulse system according to claim 10, wherein the optical pulse system comprises:

a computer-readable storage medium comprising information indicative of the dispersion characteristics of the dispersive medium, and/or a data interface arranged for receiving information indicative of the dispersion characteristics of the dispersive medium, and wherein the wavelength tunable microcavity laser system is arranged for emitting the primary optical pulse with a primary shape and/or primary spectral distribution with respect to time, which is based on the information indicative of the dispersion characteristics and tailored to the dispersion characteristics of the dispersive medium so that the primary optical pulse is arranged so that the compressed optical pulse is optimized relative to a predetermined criterium.

17. The optical pulse system according to claim 10, wherein the optical cavity comprises a MEMS component, wherein a position of the MEMS component is adjustable, wherein the cavity length of the optical cavity depends on the position of the MEMS component so that the cavity controller may control the cavity length of the optical cavity by controlling the position of the MEMS component, and wherein the Q-factor of the MEMS component is within the range from 10 to critically damped.

18. The optical pulse system according to claim 10, wherein:

a first ratio is given by peak power of the compressed optical pulse divided by the average power of the compressed optical pulse, and a second ratio is given by peak power of the primary optical pulse divided by the average power of the primary optical pulse and, wherein the first ratio is at least a factor 1000 larger than the second ratio.

* * * * *